United States Patent
Sakurada et al.

(10) Patent No.: US 7,258,744 B2
(45) Date of Patent: Aug. 21, 2007

(54) GRAPHITE HEATER FOR PRODUCING SINGLE CRYSTAL, APPARATUS FOR PRODUCING SINGLE CRYSTAL, AND METHOD FOR PRODUCING SINGLE CRYSTAL

(75) Inventors: Masahiro Sakurada, Fukushima (JP); Izumi Fusegawa, Fukushima (JP); Satoshi Soeta, Fukui (JP); Makoto Iida, Gunma (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 222 days.

(21) Appl. No.: 10/516,347

(22) PCT Filed: Dec. 8, 2003

(86) PCT No.: PCT/JP03/15655

§ 371 (c)(1),
(2), (4) Date: Nov. 30, 2004

(87) PCT Pub. No.: WO2004/061166

PCT Pub. Date: Jul. 22, 2004

(65) Prior Publication Data

US 2005/0205004 A1 Sep. 22, 2005

(30) Foreign Application Priority Data

| Dec. 27, 2002 | (JP) | ............................ 2002-382291 |
| Dec. 27, 2002 | (JP) | ............................ 2002-382307 |
| Dec. 27, 2002 | (JP) | ............................ 2002-382317 |
| Apr. 16, 2003 | (JP) | ............................ 2003-111694 |

(51) Int. Cl.
*C30B 35/00* (2006.01)
*C30B 15/20* (2006.01)

(52) U.S. Cl. ........................... 117/200; 117/13; 117/19; 117/20

(58) Field of Classification Search ................ 117/13, 117/19, 20, 200, 900
See application file for complete search history.

(56) References Cited

FOREIGN PATENT DOCUMENTS

JP    A 5-43385    2/1993

(Continued)

OTHER PUBLICATIONS

Voronkov, "The Mechanism of Swirl Defects Formation in Silicon," Journal of Crystal Growth, vol. 59, No. 3, pp. 625-643, 1982.
Dupret et al., "Global modeling of heat transfer in crystal growth furnaces," Int. J. Heat Mass. Transfer, vol. 33, No. 9, pp. 1849-1871, 1990.

(Continued)

*Primary Examiner*—Felisa Hiteshaw
(74) *Attorney, Agent, or Firm*—Oliff & Berridge, PLC

(57) ABSTRACT

The present invention discloses a graphite heater for producing a single crystal used when producing a single crystal by the Czochralski method which comprises at least a terminal part to which electric current is supplied and a cylindrical heat generating part by resistance heating and are provided so as to surround a crucible for containing a raw material melt wherein the heat generating part has heat generating slit parts formed by being provided with upper slits extending downward from the upper end and lower slits extending upwards from the lower end by turns, and a length of at least one slit of the upper slits differs from others and/or a length of at least one slit of the lower slits differs from others so that a heat generating distribution of the heat generating part may be changed. Thereby, there can be provided a graphite heater for producing a single crystal which makes it possible to produce a silicon single crystal with high productivity when the silicon single crystal is pulled in a predetermined defect-free region or a predetermined defect region.

58 Claims, 20 Drawing Sheets

FOREIGN PATENT DOCUMENTS

| | | |
|---|---|---|
| JP | A 9-227286 | 9/1997 |
| JP | A 2000-53486 | 2/2000 |
| WO | WO97/21853 | 6/1997 |

OTHER PUBLICATIONS

Vizman et al., "Three-dimensional numerical simulation of thermal convection in an industrial Czorchralski melt: comparison to experimental results," Journal of Crystal Growth 233, pp. 687-698, 2001.

Fig. 1
(a)
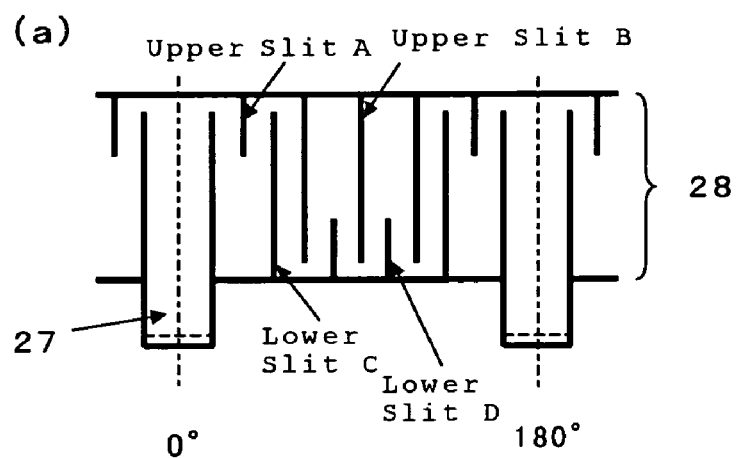
(b)
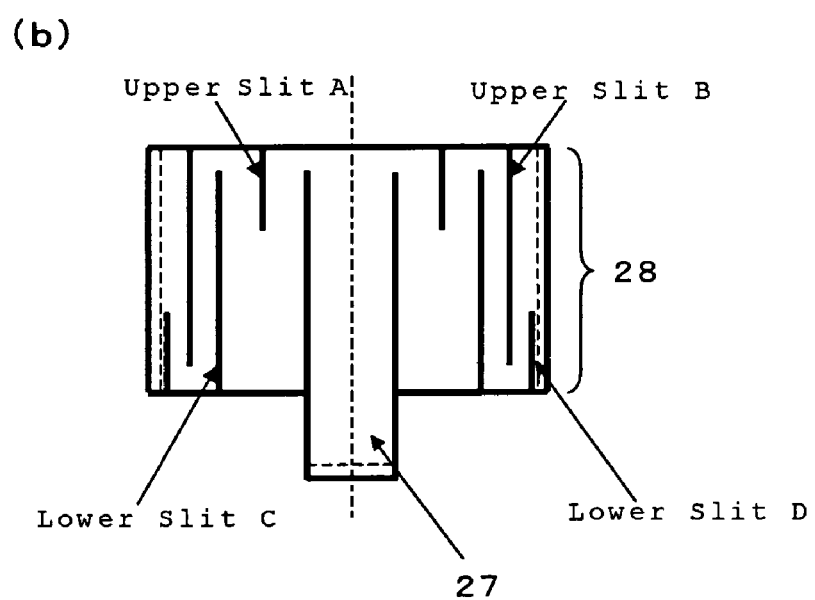

Fig. 5
(a)
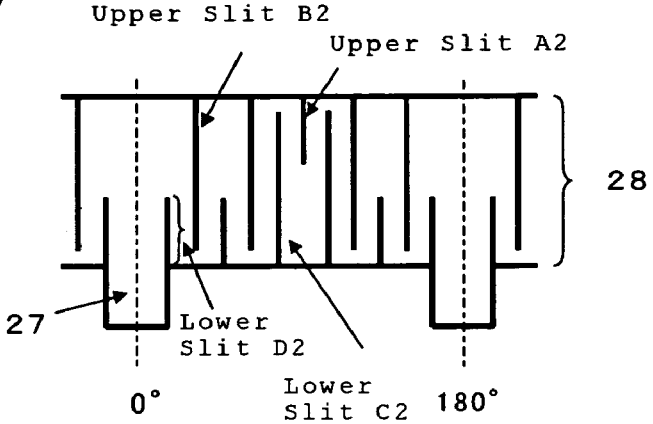
(b)
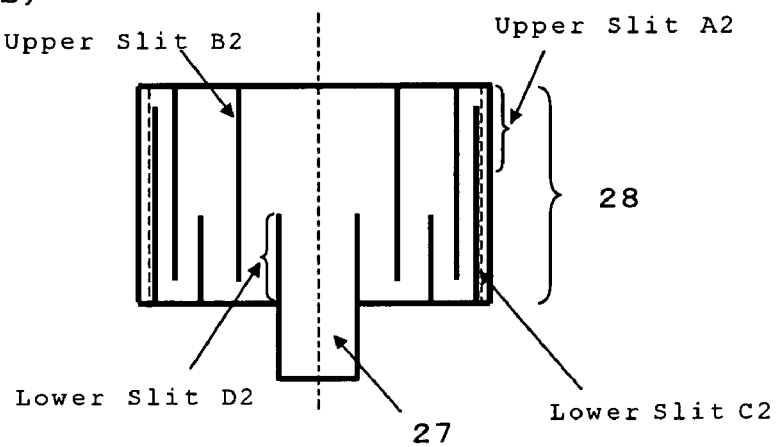

Fig. 9
(a)
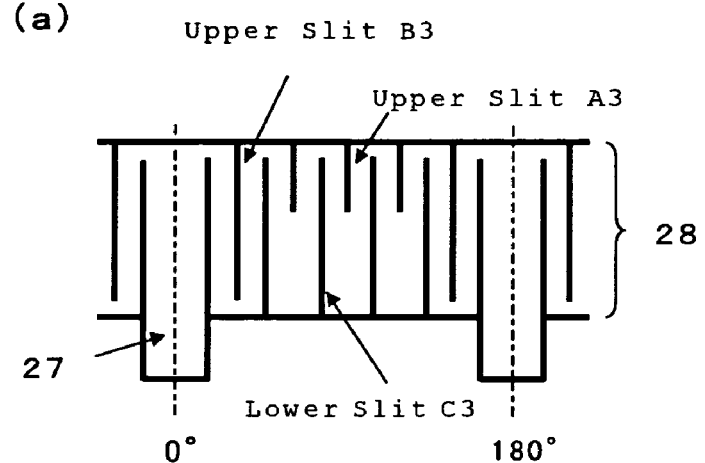
(b)
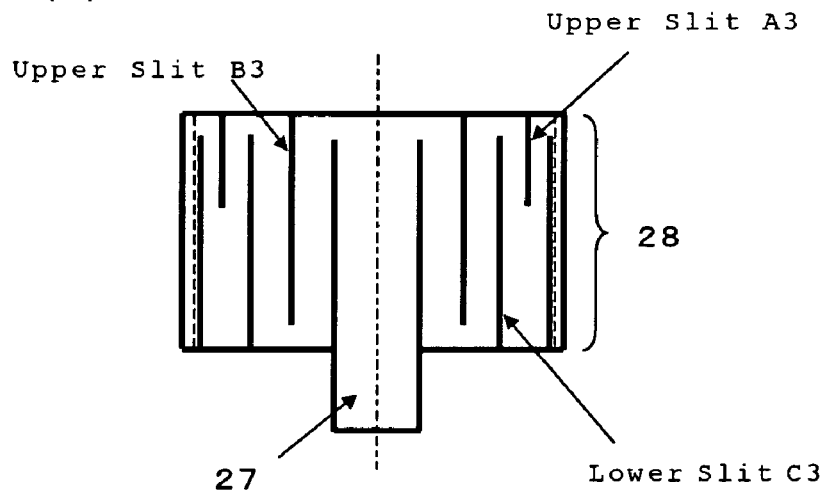

Fig. 20
(a)
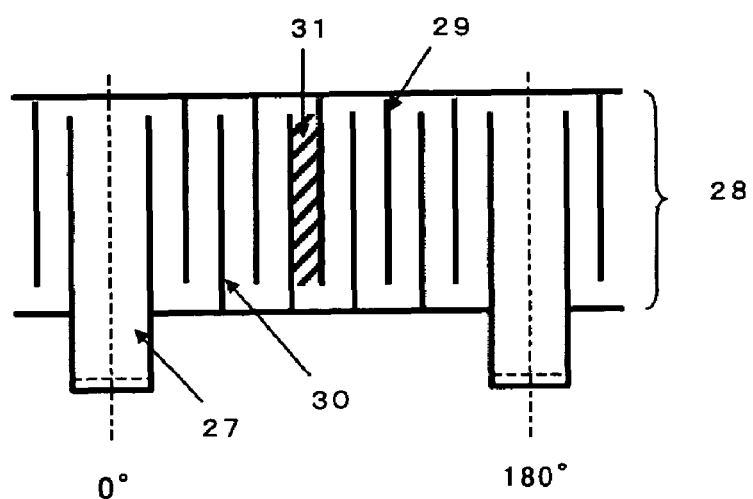
(b)
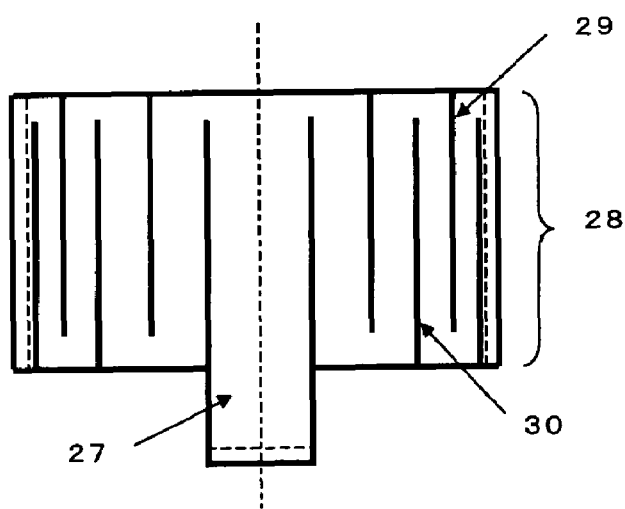

GRAPHITE HEATER FOR PRODUCING SINGLE CRYSTAL, APPARATUS FOR PRODUCING SINGLE CRYSTAL, AND METHOD FOR PRODUCING SINGLE CRYSTAL

TECHNICAL FIELD

The present invention relates to a graphite heater for producing a single crystal which is used when a single crystal is produced by the Czochralski method, and an apparatus for producing a single crystal and a method for producing a single crystal using it. More specifically, the present invention relates to a graphite heater for producing a single crystal which is suitable for controlling a crystal defect in a single crystal precisely and producing the single crystal with high productivity, and an apparatus for producing a single crystal and a method for producing a single crystal using it.

BACKGROUND TECHNOLOGY

The single crystal used as a substrate for a semiconductor device may be, for example, a silicon single crystal, and has been mainly produced according to the Czochralski method (which is abbreviated as CZ method hereinafter).

In the case that a single crystal is produced according to the CZ method, it is produced using an apparatus 10 for producing a single crystal as shown in FIG. 19. The apparatus 10 for producing a single crystal has a part for containing and melting a raw material polycrystal such as silicon, a heat insulating part for intercepting heat, or the like which are installed in a main chamber 11. A pulling chamber 12 extending upwards is connected to the ceiling part of the main chamber 11, and a mechanism for pulling a single crystal 13 with a wire 14 (not shown) is provided at the upper part thereof.

A quartz crucible 16 which contains a melt 15 of a raw material and a graphite crucible 17 which supports the quartz crucible 16 are provided in the main chamber 11, and these crucibles 16 and 17 are supported with a shaft 18 so that it may be rotated and may move up and down freely by a driving mechanism (not shown). To compensate for decline in melt level of a raw material melt 15 as a result of pulling of a single crystal 13, the driving mechanism for the crucibles 16 and 17 is designed to raise the crucibles 16 and 17 as much as the melt level declines.

A graphite heater 19 for melting the raw material is provided so that it may surround the crucibles 16 and 17. A heat insulation component 20 is provided so that the graphite heater 19 may be surrounded by it in order to prevent that the heat from the graphite heater 19 is directly radiated on the main chamber 11.

Moreover, there are provided a cooling cylinder 23 which cools the pulled up single crystal and a graphite cylinder 24 below it. A cooling gas is allowed to flow downward from the upper part of it so that it may cool the pulled single crystal. Furthermore, an inner heat insulation cylinder 25 is provided inside of the lower end of the graphite cylinder 24 so that it may face to the raw material melt 15 to intercept the radiation from the melt surface, and to release the radiant heat from the crystal upward. Furthermore, an outer heat insulating material 26 is provided outside of the lower end of the graphite cylinder 24 so that it may face to the raw material melt 15 to intercept the radiation from the melt surface, and to keep the temperature of the surface of the raw material melt.

The graphite heater 19 which has been usually used is shown in FIG. 20. The graphite heater has a cylinder form, and is mainly made of isotropic graphite. In the direct-current type which has been mainly adopted at the present, the two terminal parts 27 are provided and it has a structure wherein the graphite heater 19 is supported by the terminal parts 27. Two kinds of slits 29 and 30, the upper slit 29 prolonged downward from the upper end of the heat generating part 28 and the lower slit 30 prolonged upwards from the lower end of the heat generating part 28, are provided at several to dozens places so that the heat generating part 28 of the graphite heater 19 can generate heat more efficiently. Such a graphite heater 19 mainly generates heat especially from each heat generating slit part 31 which is between the lower end of the upper slit 29, and the upper end of the lower slit 30 among the heat generating part 28.

A raw material lump is put in the quartz crucible 16 arranged in the apparatus for producing a single crystal as described above and shown in FIG. 19, the crucible 16 is heated by the above-mentioned graphite heater 19, and the raw material lump in the quartz crucible 16 is molten. The single crystal 13 which has a desired diameter and a desired quality can be grown downward of the seed crystal 22 by bringing the seed crystal 22 fixed by a seed holder 21 which is connected to the lower end of a wire 14 into contact with the raw material melt 15 obtained by melting the raw material lump as described above, and subsequently pulling up the seed crystal 22 with rotating it. At this time, so-called necking which makes a diameter thin to be about 3 mm to form a necking part is performed after bringing the seed crystal 22 into contact with the raw material melt 15, and subsequently the diameter is increased to a desired diameter, and thereby a dislocation free crystal is pulled up.

The single crystal produced by such CZ method, for example, a silicon single crystal, is mainly used for fabrication of a semiconductor device. In recent years, in the semiconductor device, integration has become higher, and an element has become finer. The problem of the Grown-in crystal defect introduced while a crystal is grown has become important as an element has become finer.

Here, a Grown-in crystal defect will be explained.

In the silicon single crystal, when a rate of crystal growth is comparatively high, the Grown-in defects such as FPD (Flow Pattern Defect) which is considered to be caused by void wherein vacancy type point defects are gathered exist at a high density all over the region in a radial direction of a crystal, and the region where these defects exist is called V (Vacancy) region. Moreover, when a growing rate is lowered, OSF (Oxidation Induced Stacking Fault) region is generated in the shape of a ring from the circumference of a crystal as a growing rate is lowered. And there exist at a low density outside of this ring defects such as LEP (Large Etch Pit) which is considered to be caused by dislocation-loop wherein interstitial silicons are gathered, and the region where these defects exist is called I (Interstitial) region. Furthermore, if a growing rate is made low, an OSF ring will contract and disappear at the center of a wafer, and the whole surface will become I region.

In recent years, there has been found existence of a region wherein there exists neither defects due to vacancies such as FPD nor defects due to interstitial silicon such as LEP, located between the V region and the I region and outside the OSF ring. The region is called N (neutral) region. Furthermore, it has also been found that there is a region where the defects detected by Cu deposition treatment exist outside of the OSF region and in a part of the N region.

The introduced amount of these grown-in defects are considered to be determined by V/G which is the ratio of a pulling rate (V) and a temperature gradient (G) near the solid-liquid interface of a single crystal (for example, see V. V. Voronkov, Journal of Crystal Growth, 59 (1982), pp 625 to 643). That is, if the puling rate and the temperature gradient are controlled so that V/G may be constant, there can be pulled a single crystal in a desired defect region or a desired defect free region. However, when pulling a single crystal with controlling a pulling rate in a predetermined defect-free region such as N region, it is necessary for the single crystal to be grown at a low-rate. Thus, productivity is significantly lowered and the production cost is increased inevitably. Therefore, it has been desired that the productivity is raised by growing the single crystal at higher rate in order to lower the production cost of the single crystal. It can be theoretically achieved by enlarging the temperature gradient (G) near the solid-liquid interface of a single crystal.

Conventionally, there has been proposed that a single crystal is cooled during being pulled up and a temperature gradient (G) near the solid-liquid interface of a single crystal is made large, by using a chamber and a hot zone structure equipped with an effective cooling means and by intercepting the radiant heat from a heater efficiently, to achieve growing at high rate (for example, International patent publication No. 97/21853). These are performed mainly by changing the structure in a furnace at higher position than a surface of the raw material melt contained in crucible.

Moreover, there has also been proposed a method in which a heat-conductive radiation component is arranged in the lower part of a graphite crucible, the radiant heat is received from a graphite heater, heat is conducted according to heat conduction, and the radiant heat is emitted toward a crucible. By the method, the power dissipation of the graphite heater which surrounds a graphite crucible is lowered efficiently, and the radiant heat to a silicon single crystal during being pulled up is reduced by lowering total quantity of heat, and thereby the temperature gradient (G) at near the solid-liquid interface is made large, to achieve growing at high rate (for example, see Japanese Patent Application Laid-open (Kokai) No. 12-53486).

However, it is hard to say that high-rate growth of a single crystal was fully attained only by these methods, and there has been still room for improvement.

DISCLOSURE OF THE INVENTION

The present invention has been accomplished to solve the above-mentioned problems, and the first object of the present invention is to provide a graphite heater for producing a single crystal which makes it possible to provide a crystal with a desired quality by controlling a temperature distribution with high precision, and to produce the silicon single crystal with high productivity, when a single crystal is pulled up in a predetermined defect-free region with a high breakdown voltage and an excellent electrical property such as N region wherein there is no defect region existing outside of an OSF region and detected by Cu deposition treatment or a predetermined defect region, and to provide the apparatus for producing the single crystal and the method for producing the single crystal using it.

Moreover, the second object of the present invention is to provide a graphite heater for producing a single crystal which makes it possible to provide a crystal with a desired quality by controlling a temperature distribution with high precision, and to produce the silicon single crystal with high productivity, not only in the case that a single crystal is pulled up in a predetermined defect-free region with a high breakdown voltage and an excellent electrical property such as N region wherein there is no defect region existing outside of an OSF region and detected by Cu deposition treatment or a predetermined defect region, but also in the case that a single crystal wherein uniformity of oxygen concentration in a radial direction of the crystal is improved is pulled up, and to provide the apparatus for producing a single crystal and the method for producing a single crystal using it.

To achieve the above mentioned object, in the first embodiment of the present invention, there can be provided a graphite heater for producing a single crystal used when producing a single crystal by the Czochralski method which comprises at least a terminal part to which electric current is supplied and a cylindrical heat generating part by resistance heating and are provided so as to surround a crucible for containing a raw material melt wherein the heat generating part has heat generating slit parts formed by being provided with upper slits extending downward from the upper end and lower slits extending upwards from the lower end by turns, and a length of at least one slit of the upper slits differs from others and/or a length of at least one slit of the lower slits differs from others so that a heat generating distribution of the heat generating part may be changed.

As described above, if a length of at least one slit of the upper slits differs from others and/or a length of at least one slit of the lower slits differs from others so that a heat generating distribution of the heat generating part may be changed, a desired convection is caused in the raw material melt. If the temperature gradient (G) near the solid-liquid interface of the silicon single crystal while being pulled up is raised by controlling a convection and a convection is caused so that a crystal-growth interface may be easily changed to an upper convex form, for example a growing rate of the silicon single crystal in N region can be made high. Moreover, oxygen concentration in the single crystal to be produced can be controlled in a wide range from low oxygen to high oxygen, by regulation of the convection by heat generating distribution of this heater, and therefore, a single crystal having a desired oxygen concentration can be produced with high precision.

In this case, it is preferable that the upper slit and/or lower slit having a different length from other slits is periodically formed in a circumferential direction, resulting in that the heat generating distribution of the heat generating part is such that the high temperature part and the low temperature part are distributed periodically in a circumferential direction, and for example, the cycle of the heat generating distribution is such that one cycle is 180°.

As descried above, if the upper slit and/or lower slit having a different length from other slits is periodically formed in a circumferential direction, resulting in that the heat generating distribution of the heat generating part is such that the high temperature part and the low temperature part are distributed periodically in a circumferential direction, the heat generating distribution of the above-mentioned heat generating part can promote a convection within a raw material melt not only to the vertical direction but to a circumferential direction.

In this case, it is preferable that the cycle of the heat generating distribution is such that the cycle based on the upper slit and the cycle based on the lower slit are shifted by 45° or more and 135° or less in a circumferential direction.

As described above, when the cycle of the heat generating distribution is such that the cycle based on the upper slit and the cycle based on the lower slit are shifted by 45° or more and 135° or less in a circumferential direction, a lengthwise convection in a direction from a bottom of a crucible to the surface of a raw material melt can be promoted further to a helical direction.

In this case, it is preferable that it has two or more kinds of the upper slit having a length different from other slits and/or two or more kinds of the lower slit having a length different from other slits.

As described above, if it has two or more kinds of the upper slit having a length different from other slits and/or two or more kinds of the lower slit having a length different from other slits, the heat generating distribution of the heat generating part can be adjusted easily and highly precisely.

In this case, it is preferable that the upper slit and/or the lower slit having a length different from other slits has a length shorter than 50% of a length from the upper end to the lower end of the cylindrical heat generating part.

As described above, if the upper slit and/or the lower slit having a length different from other slits has a length shorter than 50% of a length from the upper end to the lower end of the cylindrical heat generating part, the heat generating slit part can be easily distributed in the upper side and/or the lower side of the central line dividing the above-mentioned heat generating part in a height direction to the upper part and the lower part.

In addition, a heat generating efficiency can be maintained by setting a length of the upper slit and/or the lower slit having a length different from other slits to about 10% or more of a length from the upper end to the lower end of the above-mentioned cylindrical heat generating part. Moreover, a strength of the body of the heater can be maintained by setting the length of the upper slit and/or the lower slit to about 90% or less of a length from the upper end to the lower end of the heat generating part.

Furthermore, the present invention provides an apparatus for producing a single crystal at least equipped with the above-mentioned graphite heater for producing a single crystal, and also provides a method for producing a single crystal according to the Czochralski method using the apparatus for producing a single crystal.

If a single crystal is produced by the CZ method using such an apparatus for producing a crystal equipped with the heater for producing a single crystal of the present invention, a single crystal with high quality can be produced with high productivity.

Furthermore, the present invention provides a graphite heater for producing a single crystal used when producing a single crystal by the Czochralski method which comprises at least a terminal part to which electric current is supplied and a cylindrical heat generating part by resistance heating and are provided so as to surround a crucible for containing a raw material melt wherein a heat generating distribution of the heat generating part is such that a high temperature part and a low temperature part are periodically distributed in a circumferential direction, and the cycle of the heat generating distribution of the heat generating part is shifted between the upper side and the lower side of a central line dividing the heat generating part in a height direction to the upper side and the lower side.

As described above, since it is a heater wherein a heat generating distribution of the heat generating part is such that a high temperature part and a low temperature part are periodically distributed in a circumferential direction, and the cycle of the heat generating distribution of the heat generating part is shifted between the upper side and the lower side of a central line dividing the heat generating part in a height direction to the upper side and the lower side, a lengthwise convection in a direction from a bottom of a crucible to a surface of a raw material melt can be promoted further to a helical direction. Thereby, the temperature gradient (G) near the solid-liquid interface of the silicon single crystal while being pulled up is raised, resulting in that a crystal-growth interface becomes easy to be changed to an upper convex form. Thus, for example a growing rate of the silicon single crystal having a desired quality such as N region can be made high.

In this case, it is preferable that the periodic heat generating distribution in a circumferential direction of the heat generating part is made by changing any one or more of a wall thickness of a heat generating slit part, a width of a heat generating slit part, a length of a slit, and a material of a heat generating slit part.

As described above, the periodic heat generating distribution in a circumferential direction of the heat generating part can be adjusted easily by changing in a circumferential direction any one or more of a wall thickness of a heat generating slit part, a width of a heat generating slit part, a length of a slit, and a material of a heat generating slit part.

In this case, it is preferable that the cycle of the heat generating distribution is such that one cycle is 180°.

As described above, if the cycle of the heat generating distribution is such that one cycle is 180°, a convection in a circumferential direction in a raw material melt can be promoted more surely.

In this case, it is preferable that a shift of the cycle of the heat generating distribution between the upper side and the lower side of the central line is 45° or more and 135° or less.

As described above, when a shift of the cycle of the heat generating distribution between the upper side and the lower side of the central line is 45° or more and 135° or less in a circumferential direction, a lengthwise convection in a direction from a bottom of a crucible to a surface of a raw material melt can be promoted further to a helical direction.

Furthermore, the present invention provides an apparatus for producing a single crystal equipped with the above-mentioned heater for producing a single crystal, and also provides a method for producing a single crystal according to the Czochralski method using this apparatus for producing a single crystal.

If a single crystal is produced by the CZ method using such an apparatus for producing a single crystal equipped with the heater for producing a single crystal of the present invention, a single crystal with a high quality can be produced with sufficient productivity.

In the 2nd embodiment of the present invention, there is provided a graphite heater for producing a single crystal used when producing a single crystal by the Czochralski method which comprises at least a terminal part to which electric current is supplied and a cylindrical heat generating part by resistance heating and are provided so as to surround a crucible for containing a raw material melt wherein the heat generating part has heat generating slit parts formed by being provided with upper slits extending downward from the upper end and lower slits extending upwards from the lower end by turns, and a length of the upper slit consists of two kinds, namely longer and shorter, a length of the lower slit consists of two kinds, namely longer and shorter, and the number of the shorter lower slit is more than the number of the shorter upper slit to change a heat generating distribution in the heat generating part.

As described above, if a length of the upper slit consists of two kinds, namely longer and shorter, a length of the lower slit consists of two kinds, namely longer and shorter, and the number of the shorter lower slit is more than the number of the shorter upper slit to change a heat generating distribution in the heat generating part, a lengthwise convection in a direction from a bottom of a crucible to a surface of a raw material melt can be generated by a heat generating distribution which the heater itself has. By the lengthwise convection, the temperature gradient (G) near the solid-liquid interface of the silicon single crystal while being pulled up is raised, resulting in that a crystal-growth interface becomes easy to be changed to an upper convex form. Thus, for example a growing rate of the silicon single crystal in N region can be made high. Moreover, by regulation of the convection by heat generating distribution of this heater, oxygen concentration in the single crystal to be produced can be controlled in a wide range from low oxygen to high oxygen, and a single crystal having a desired oxygen concentration can be produced with high precision.

In this case, it is preferable that the number of the shorter lower slit is twice or more and 5 times or less of the number of the shorter upper slit.

As described above, if the number of the shorter lower slit is twice or more and 5 times or less of the number of the shorter upper slit, a lengthwise convection from a bottom of a crucible to a surface of a raw material melt can be appropriately promoted in the raw material melt, and a temperature gradient (G) near the solid-liquid interface of the crystal can be made almost uniform in a radial direction. It can follow that the produce margin of a predetermined defect-free region such as N region can be expanded, and thus the single crystal of a predetermined defect-free region can be produced stably and at high rate.

In this case, it is preferable that the two kinds of the upper slit and the lower slit are formed periodically in a circumferential direction, resulting in that the heat generating distribution of the heat generating part is such that a high temperature part and a low temperature part are periodically distributed in a circumferential direction, and for example the cycle of the heat generating distribution is such that one cycle is 180°.

As described above, if the two kinds of the upper slit and the lower slit are formed periodically in a circumferential direction, resulting in that the heat generating distribution of the heat generating part is such that a high temperature part and a low temperature part are periodically distributed in a circumferential direction, a convection within a raw material melt can be promoted not only in a vertical direction but in a circumferential direction.

In this case, it is preferable that the cycle of the heat generating distribution is such that the cycle based on the upper slit and the cycle based on the lower slit are shifted by 45° or more and 135° or less in a circumferential direction.

As described above, when the cycle of the heat generating distribution is such that the cycle based on the upper slit and the cycle based on the lower slit are shifted by 45° or more and 135° or less in a circumferential direction, a lengthwise convection in a direction from a bottom of a crucible to a surface of a raw material melt can be promoted further to a helical direction.

In this case, it is preferable that the shorter upper slit and lower slit has a length shorter than 50% of a length from the upper end to the lower end of the heat generating part, and the longer upper slit and lower slit has a length of 70% or longer of a length from the upper end to the lower end of the heat generating part.

As described above, if the shorter upper slit and lower slit has a length shorter than 50% of a length from the upper end to the lower end of the heat generating part, and the longer upper slit and lower slit has a length of 70% or longer of a length from the upper end to the lower end of the heat generating part, the heat generating slit part can be easily distributed in the upper side and the lower side of the central line dividing the above-mentioned heat generating part in a height direction to the upper part and the lower part.

In addition, a heat generating efficiency can be maintained by setting a length of the shorter upper slit and lower slit to about 10% or more of a length from the upper end to the lower end of the above-mentioned cylindrical heat generating part. Moreover, a strength of the body of the heater can be maintained by setting the length of the longer upper slit and lower slit to a length of about 90% or less of a length from the upper end to the lower end of the heat generating part.

Furthermore, the present invention provides an apparatus for producing a single crystal at least equipped with the above-mentioned graphite heater for producing a single crystal, and also provides a method for producing a single crystal according to the Czochralski method using the apparatus for producing a single crystal.

If a single crystal is produced by the CZ method using such an apparatus for producing a single crystal equipped with the heater for producing a single crystal of the present invention, a single crystal with a high quality can be produced with sufficient productivity.

In the third embodiment of the present invention, there is provided a graphite heater for producing a single crystal used when producing a single crystal by the Czochralski method which comprises at least a terminal part to which electric current is supplied and a cylindrical heat generating part by resistance heating and are provided so as to surround a crucible for containing a raw material melt wherein the heat generating part has heat generating slit parts formed by being provided with upper slits extending downward from the upper end and lower slits extending upwards from the lower end by turns, and a length of the upper slit consists of two kinds, namely longer and shorter, and a width of a lower end of the longer upper slit is wider than a width of an upper end thereof, and/or a width of a lower end of the lower slit is wider than a width of an upper end thereof to change the heat generating distribution of the heat generating part.

As described above, if a length of the upper slit consists of two kinds, namely longer and shorter, and a width of a lower end of the longer upper slit is wider than a width of an upper end thereof, and/or a width of a lower end of the lower slit is wider than a width of an upper end thereof to change the heat generating distribution of the heat generating part, a lengthwise convection in a direction from a bottom of a crucible to a surface of a raw material melt can be generated in the raw material melt by an heat generating distribution which the heater itself has. By such a lengthwise convection, the temperature gradient (G) near the solid-liquid interface of the silicon single crystal while being pulled up is raised, resulting in that a crystal-growth interface becomes easy to be changed to an upper convex form. Thus, for example a growing rate of the silicon single crystal in N region can be made high. Moreover, by regulation of the convection by heat generating distribution of this heater, oxygen concentration in the single crystal to be produced can be controlled in a wide range from low oxygen to high oxygen, and a single crystal having a desired oxygen concentration can be produced with high precision.

In this case, it is preferable that the lower end of the longer upper slit has a width of 1.5 times or more and 2.5 times or less of a width of the upper end thereof, and the lower end of the lower slit has a width of 1.5 times or more and 2.5 times or less of a width of the upper end thereof.

As described above, if the lower end of the longer upper slit has a width of 1.5 times or more and 2.5 times or less of a width of the upper end thereof, and the lower end of the lower slit has a width of 1.5 times or more and 2.5 times or less of a width of the upper end thereof, the heat generating center of the heat generating slit part can be distributed in the lower side of central line dividing the above-mentioned heat generating part in a height direction to the upper part and the lower part. Therefore, by the effect of heating mainly a bottom of the crucible or an R part of the crucible, a lengthwise convection in a direction from a bottom of the crucible to a surface of the raw material melt can be surely promoted. Moreover, if it is in the above-mentioned range, the temperature gradient (G) near the solid-liquid interface in the crystal can be almost uniform in a radial direction, since a convection is adequate. Accordingly, a production margin of a certain defect-free region such as N region can be enlarged, and a single crystal having a certain defect free region can be produced stably and at high rate.

In this case, it is preferable that the shorter upper slit has a length shorter than 50% of a length from the upper end to the lower end of the heat generating part, and the longer upper slit has a length of 70% or longer of a length from the upper end to the lower end of the heat generating part.

As described above, if the shorter upper slit has a length shorter than 50% of a length from the upper end to the lower end of the heat generating part, and the longer upper slit has a length of 70% or longer of a length from the upper end to the lower end of the heat generating part, the heat generating center of the heat generating slit part can be distributed in the upper side and the lower side of the central line dividing the above-mentioned heat generating part in a height direction to the upper part and the lower part.

In addition, heat generating efficiency can be maintained by setting a length of the shorter upper slit to about 10% or more of the length from an upper end to the lower end of the heat generating part. Moreover, a strength of the body of the heater can be maintained by setting the length of the longer upper slit to about 90% or less of a length from the upper end to the lower end of the heat generating part.

In this case, it is preferable that the two kinds of the upper slit are formed periodically in a circumferential direction, resulting in that the heat generating distribution of the heat generating part is such that a high temperature part and a low temperature part are periodically distributed in a circumferential direction, and for example the cycle of the heat generating distribution is such that one cycle is 180°.

As described above, if the two kinds of the upper slit are formed periodically in a circumferential direction, resulting in that the heat generating distribution of the heat generating part is such that a high temperature part and a low temperature part are periodically distributed in a circumferential direction, a convection within a raw material melt can be promoted not only in a vertical direction but in a circumferential direction.

Furthermore, the present invention provides an apparatus for producing a single crystal at least equipped with the above-mentioned graphite heater for producing a single crystal, and also provides a method for producing a single crystal according to the Czochralski method using the apparatus for producing a single crystal.

If a single crystal is produced by the CZ method using such an apparatus for producing a crystal equipped with the heater for producing a single crystal of the present invention, a single crystal with a high quality can be produced with sufficient productivity.

In the forth embodiment of the present invention, there is provided a graphite heater for producing a single crystal used when producing a single crystal by the Czochralski method which comprises at least a terminal part to which electric current is supplied and a cylindrical heat generating part by resistance heating and are provided so as to surround a crucible for containing a raw material melt wherein the heat generating part has heat generating slit parts formed by being provided with upper slits extending downward from the upper end and lower slits extending upwards from the lower end by turns, and each of a length of the upper slit and a length of the lower slit consists of two kinds, namely longer and shorter, and the number of the shorter upper slit is more than the number of the shorter lower slit, to change the heat generating distribution of the heat generating part.

As described above, if each of a length of the upper slit and a length of the lower slit consists of two kinds, namely longer and shorter, and the number of the shorter upper slit is more than the number of the shorter lower slit, to change the heat generating distribution of the heat generating part, a lengthwise convection in a direction from a bottom of the crucible to a surface of the raw material melt can be generated in the raw material melt by a heat generating distribution which the heater itself has. By such a lengthwise convection, the temperature gradient (G) near the solid-liquid interface of the silicon single crystal while being pulled up is raised, and thus, a crystal-growth interface may be easily changed to an upper convex form. As a result, for example a growing rate of the silicon single crystal in N region can be made high. Moreover, by regulation of the convection by the heat generating distribution of this heater, oxygen concentration in the single crystal to be produced can be controlled in a wide range from low oxygen to high oxygen, and a single crystal having a desired oxygen concentration can be produced with high precision. Furthermore, an oxygen concentration of the single crystal to be produced can be made almost uniform in a radial direction of the crystal.

In this case, it is preferable that the number of the shorter upper slit is 1.5 times or more and 5 times or less of the number of the shorter lower slit.

As described above, if the number of the shorter upper slit is 1.5 times or more and 5 times or less of the number of the shorter lower slit, an oxygen concentration in the single crystal to be produced can be made uniform further in a radial direction of the crystal. Moreover, a lengthwise convection in a direction from a bottom of the crucible to a surface of the raw material melt can be appropriately promoted. In addition, the temperature gradient (G) near the solid-liquid interface of the crystal can be almost uniform in a radial direction. Accordingly, a production margin of a certain defect-free region such as N region can be enlarged, and a single crystal having a certain defect free region can be produced stably and at high rate.

In this case, it is preferable that the two kinds of the upper slit and the lower slit are formed periodically in a circumferential direction, resulting in that the heat generating distribution of the heat generating part is such that a high temperature part and a low temperature part are periodically distributed in a circumferential direction, and for example the cycle of the heat generating distribution is such that one cycle is 180°.

As described above, if the two kinds of the upper slit and the lower slit are formed periodically in a circumferential direction, resulting in that the heat generating distribution of the heat generating part is such that a high temperature part and a low temperature part are periodically distributed in a circumferential direction, a convection within the raw material melt can be promoted not only in a vertical direction but in a circumferential direction.

In this case, it is preferable that the cycle of the heat generating distribution is such that the cycle based on the upper slit and the cycle based on the lower slit are shifted by 45° or more and 135° or less in a circumferential direction.

As described above, when the cycle of the heat generating distribution is such that the cycle based on the upper slit and the cycle based on the lower slit are shifted by 45° or more and 135° or less in a circumferential direction, a lengthwise convection in a direction from a bottom of the crucible to a surface of the raw material melt can be promoted further to a helical direction.

In this case, it is preferable that the shorter upper slit and lower slit has a length shorter than 50% of a length from the upper end to the lower end of the heat generating part, and the longer upper slit and lower slit has a length of 70% or longer of a length from the upper end to the lower end of the heat generating part.

As described above, if the shorter upper slit and lower slit has a length shorter than 50% of a length from the upper end to the lower end of the heat generating part, and the longer upper slit and lower slit has a length of 70% or longer of a length from the upper end to the lower end of the heat generating part, the heat generating slit part can be easily distributed in the upper side or the lower side of the central line dividing the above-mentioned heat generating part in a height direction to the upper part and the lower part.

Furthermore, the present invention provides an apparatus for producing a single crystal at least equipped with the above-mentioned graphite heater for producing a single crystal, and also provides a method for producing a single crystal according to the Czochralski method using the apparatus for producing a single crystal.

If a single crystal is produced by the CZ method using such an apparatus for producing a single crystal equipped with the heater for producing a single crystal of the present invention, a single crystal with high quality which contains no crystal defect and has a high uniformity of an oxygen concentration in a radial direction of the crystal can be produced with sufficient productivity.

As explained above, the present invention can provide a silicon single crystal with high productivity, when the single crystal is pulled in a predetermined defect-free region with a high breakdown voltage and an excellent electrical property such as N region wherein there is no defect region existing outside of an OSF region and detected by Cu deposition treatment or a predetermined defect region.

Furthermore, the present invention can provide a silicon single crystal with high productivity, when the single crystal is pulled in a predetermined defect-free region with a high breakdown voltage and an excellent electrical property such as N region wherein there is no defect region existing outside of an OSF region and detected by Cu deposition treatment or a predetermined defect region, and furthermore, an oxygen concentration of the single crystal to be produced can be made almost uniform in a radial direction of the crystal.

BRIEF DESCRIPTION OF THE DRAWINGS

FIG. 1 is a schematic view showing one example of the graphite heater of the present invention.
(a) an unfolded view, (b) a side view.

FIG. 5 is a schematic view showing one example of the graphite heater of the present invention.
(a) a unfolded view, (b) a side view.

FIG. 9 is a schematic view showing one example of the graphite heater of the present invention.
(a) a unfolded view, (b) a side view.

The growing rate of the N region has been found by studying a relation of a growing rate of a single crystal and a crystal-defect distribution.

Figure 14:
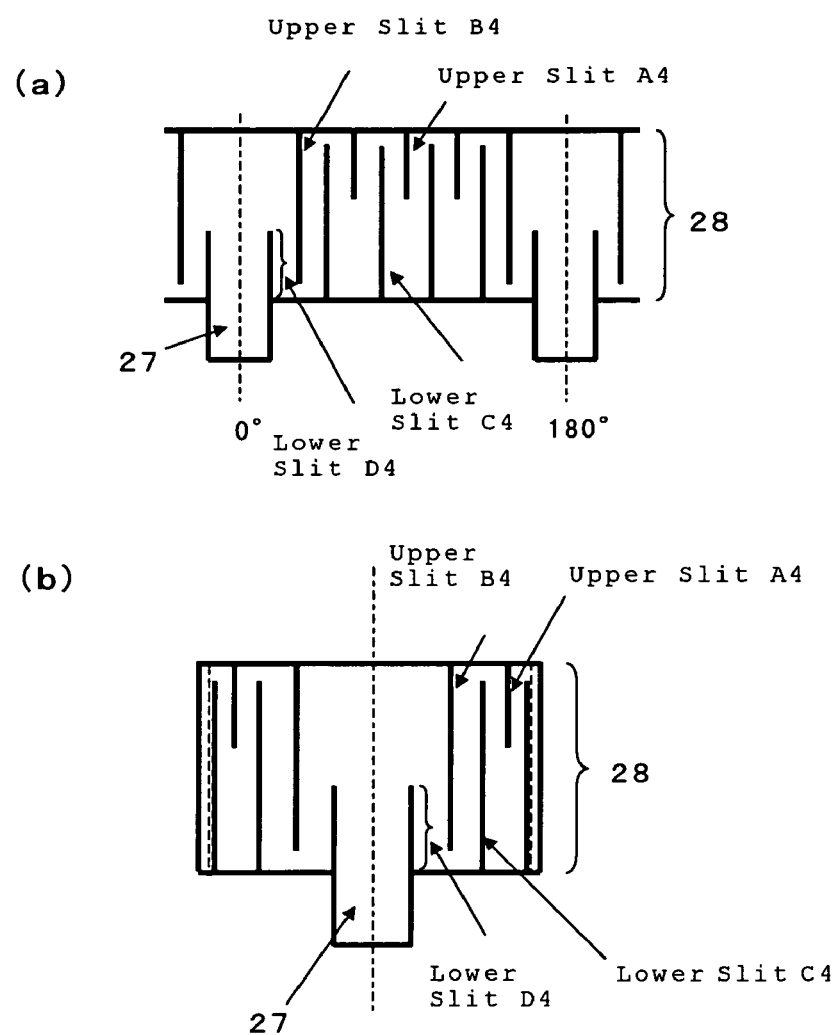

FIG. 14 is a schematic view showing one example of the graphite heater of the present invention.
(a) a unfolded view, (b) a side view.

Figure 15:
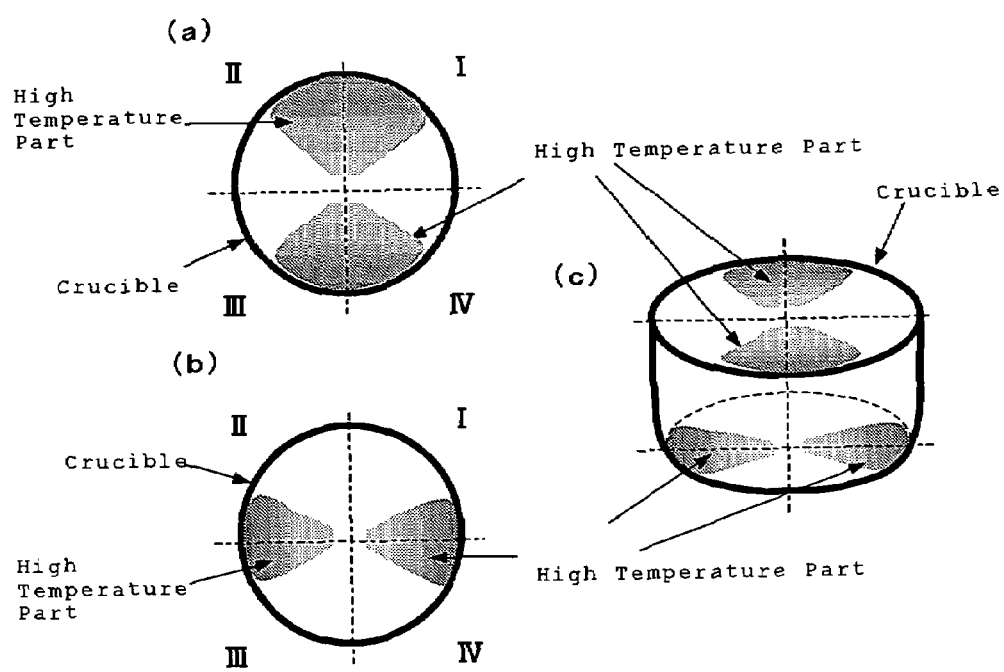

FIG. 15 is a conceptual view showing a temperature distribution of the raw material melt in a crucible when heating the crucible by the graphite heater shown in FIG. 14.
(a) a temperature distribution on the surface side of the raw material melt,
(b) a temperature distribution of the raw material melt on the side of a bottom of the crucible,
(c) a temperature distribution of the whole raw material melt.

Figure 16:
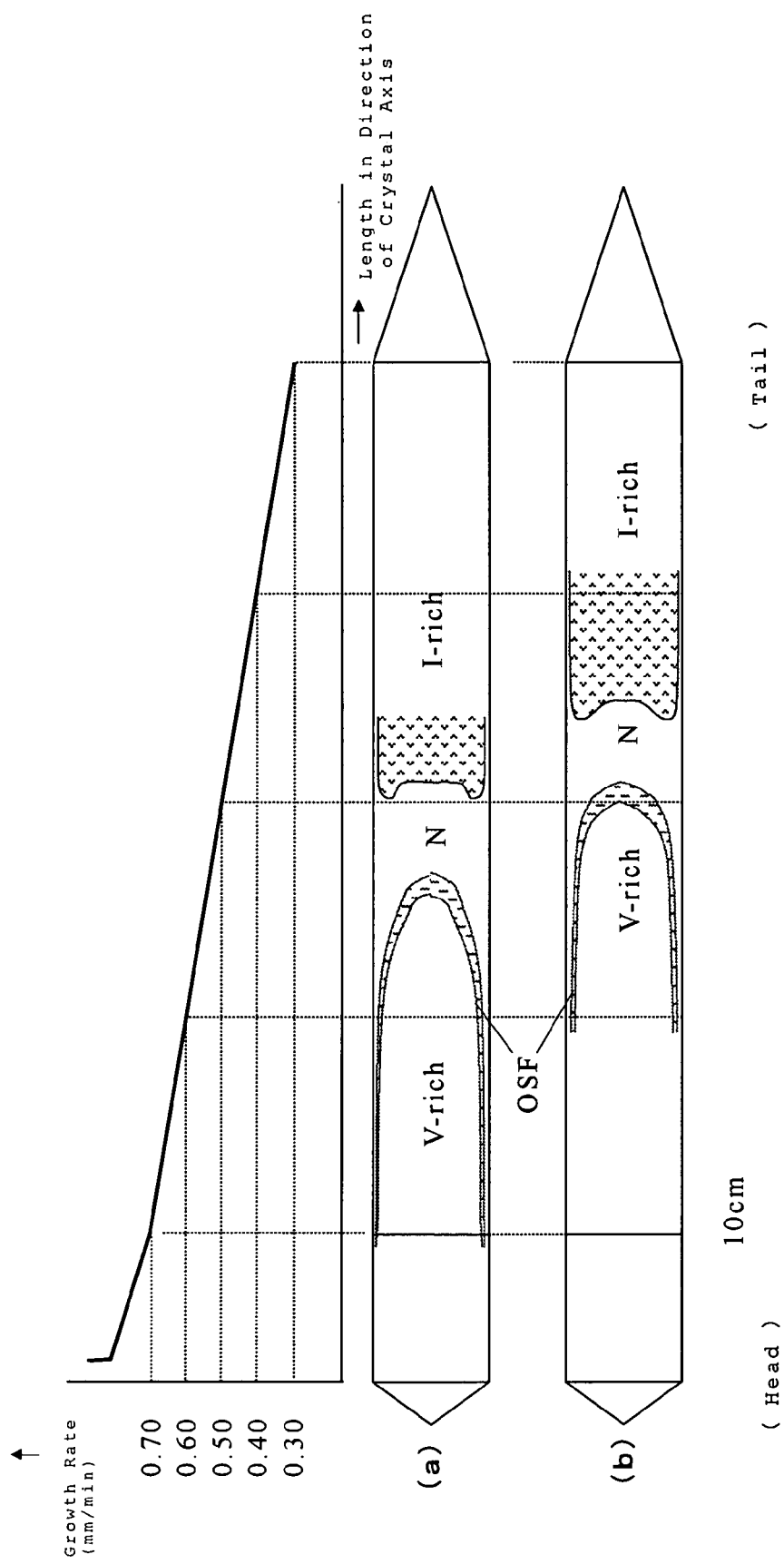

FIG. 16 is an explanatory view showing a growing rate of a single crystal, and a crystal-defect distribution.
(a) Example 4, (b) Comparative Example 4.

Figure 17:
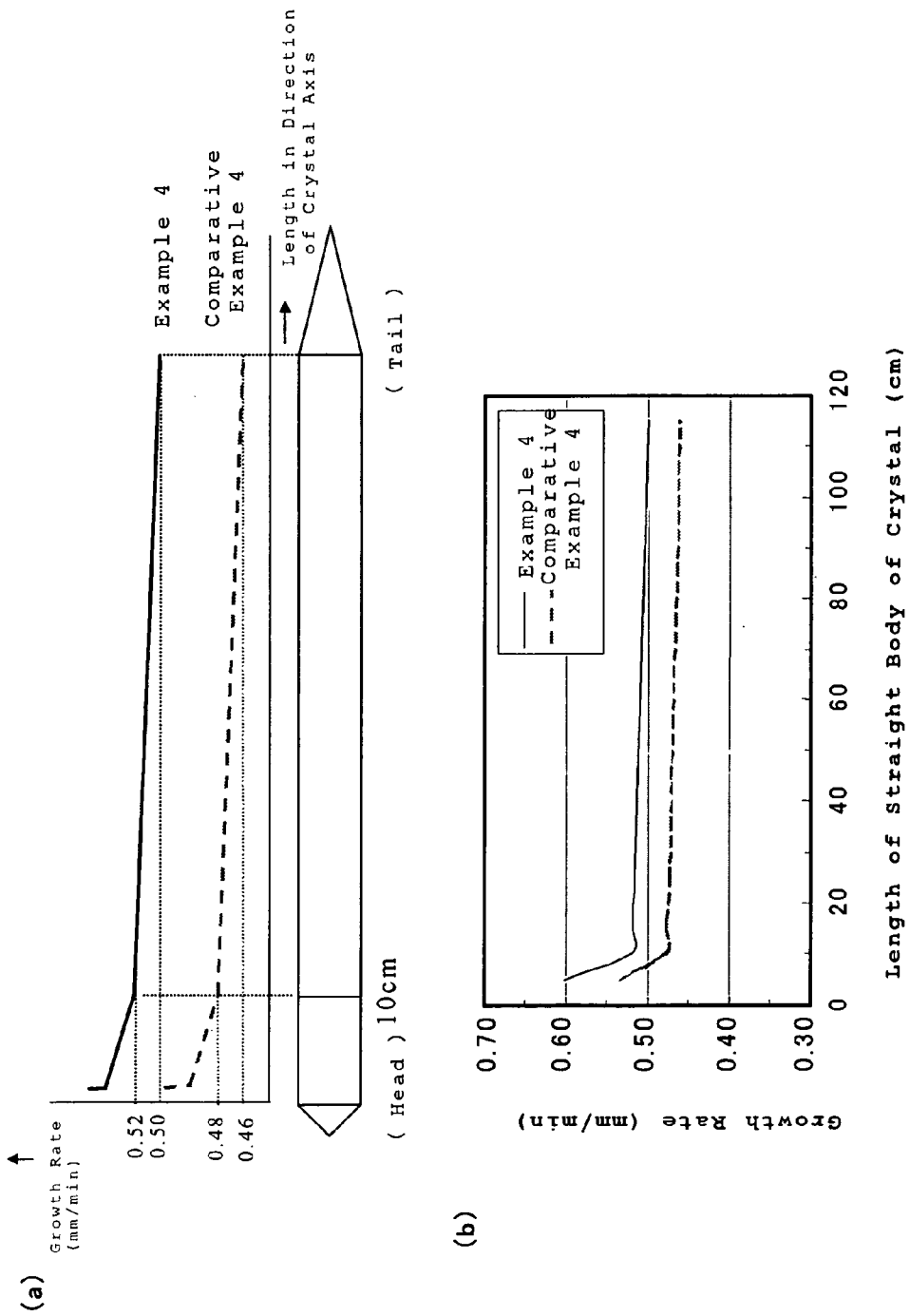

FIG. 17 is a comparative view comparing Example 4 and Comparative Example 4 when a silicon single crystal is grown with controlling a growing rate in N region in which defect is not detected by Cu deposition treatment ((a), (b)). The growing rate of the N region has been found by studying a relation of a growing rate of a single crystal and a crystal-defect distribution.

Figure 18:
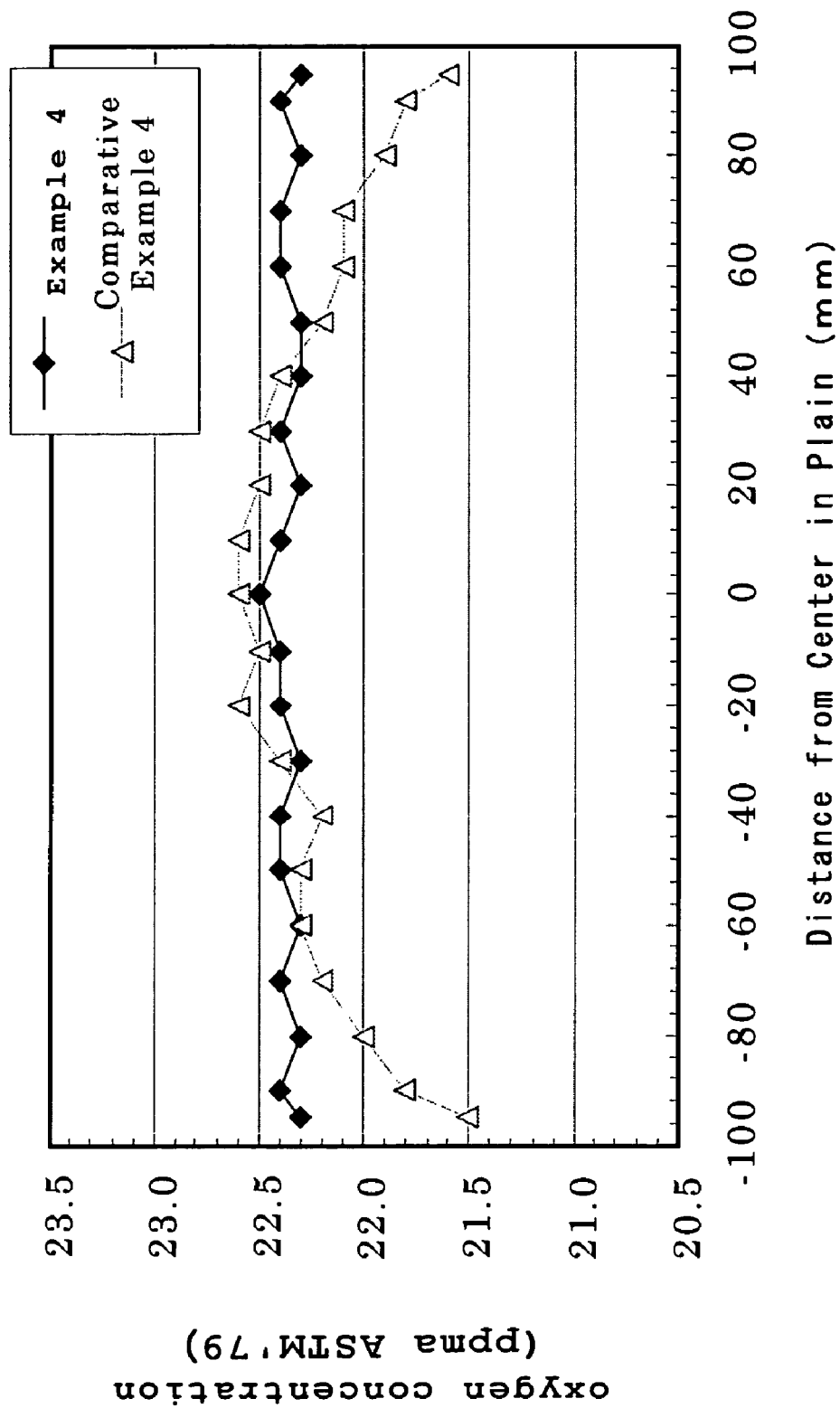

FIG. 18 is a graph showing a distribution of an oxygen concentration in a radial direction in plane.

Figure 19:
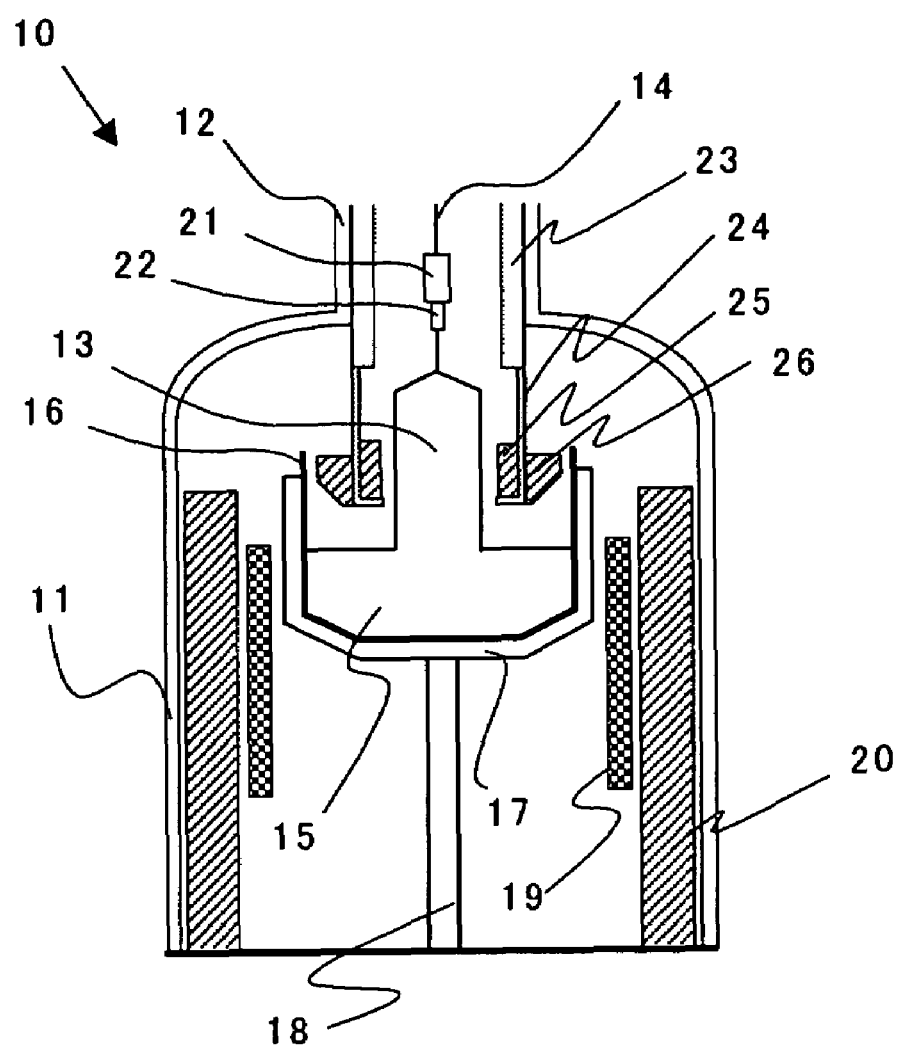

FIG. 19 is a schematic view of an apparatus for producing a single crystal.

FIG. 20 is a schematic view showing one example of the conventional graphite heater.
(a) a unfolded view, (b) a side view.

DESCRIPTION OF THE INVENTION AND EMOBDIMENT

Hereafter, the present invention will be explained.

The inventors of the present invention have performed simulation analysis of a relation of a convection caused by a temperature distribution of the raw material melt when a graphite heater heats quartz crucible and the temperature gradient (G) near the solid-liquid interface of the silicon single crystal while being pulled up, by software such as FEMAG and STHAMAS-3D, in the case that the silicon single crystal is produced by CZ method.

FEMAG is a global heat transfer analysis software disclosed in the reference (F. Dupret, P. Nicodeme, Y. Ryckmans, P. Wouters, and M. J. Crochet, Int. J. Heat Mass Transfer, 33, 1849 (1990)), and STHAMAS-3D is a global heat transfer analysis software disclosed in the reference (D. Vizman, O. Graebner, G. Mueller, Journal of Crystal Growth, 233, 687-698 (2001)).

As a result of the simulation analysis, the inventors of the present invention have found that it is effective for raising temperature gradient (g) to promote a lengthwise convection in a direction from a bottom of a crucible to a surface of a melt of a raw material and to promote the convention to a helical direction.

As the means to promote a lengthwise convection, there can be mentioned a method of providing a bottom heater for heating the raw material melt in the crucible from a bottom of the crucible in addition to a general graphite heater, or a method of providing a graphite heater with two sections of the upper section and the lower section for heating the raw material melt in the crucible from the top and the bottom, or the like. However, an economical merit of these methods is not expectable, since the equipment in a furnace is complicated and power dissipation is high in these methods. Then, the inventors of the present invention have found that a single crystal having an intended quality can be produced at low cost and at high productivity, by using only one graphite heater arranged so that it may surround a crucible, promoting a lengthwise convection in a direction from a bottom of the crucible to a surface of the raw material melt, and promoting the convection to a helical direction. Thereby, the present invention has been completed.

On the other hand, the temperature distribution in a vertical direction of a raw material melt may affect the quality of the produced single crystal. Especially, the oxygen that elutes in a raw material melt from the quartz crucible during production of a single crystal and is incorporated in a crystal forms oxide precipitate in a bulk of a wafer in the heat treatment process when producing a wafer from the single crystal. And, the oxide precipitate can be a gettering site of heavy metal element which diffuses inside during a process. Thus, the oxide plays a very important role for the quality of the produced wafer. Therefore, the demand that a distribution of a concentration of the oxygen which is a source of formation of the oxide precipitate is made uniform in a radial direction of a crystal has become severe as performance of a device becomes higher in recent years.

Further, the inventors have found that the oxygen concentration distribution in the radial direction of a crystal can be made further uniform, by designing so that, among the heat generating peaks of two parts of upper side and lower side, a heat generating intensity of the peak of the upper side may be larger than a heat generating intensity of the peak of the lower side.

From the above fact, the inventors have found that a single crystal having an intended quality can be produced at low cost and at high productivity, by using only one graphite heater arranged so that it may surround a crucible, promoting a lengthwise convection in a direction from a bottom of a crucible to a surface of a raw material melt, and promoting the convection to a helical direction, and further, making a heat generating power to the upper part of the heater larger than a heat generating power to the bottom part of the crucible or R part of the crucible. Thereby, the present invention has been completed.

The embodiments of the present invention will be described below in more detail. However, the present invention is not limited thereto.

According to the first embodiment of the present invention, the graphite heater of the present invention is not designed so that a heat generating distribution of the heat generating part is made uniform over a circumferential direction such as the conventional one, but is designed so that one graphite heater may have a peak of an heat generating distribution at a bottom part of the crucible and an R part of the crucible, and/or at the upper part of the crucible.

One example of the graphite heater of the present invention is shown in FIG. 1. In this graphite heater, upper slits extending downward from the upper end of the heat generating part 28 and lower slits extending upwards from the lower end of the heat generating part are provided by turns so that the electric current way of the electric current applied from the terminal part 27 may serve as a zigzag configuration in the vertical direction in the heat generating part 28. The heat generating distribution of the heat generating part is changed by changing a size and an arrangement of these slits. Therefore, there are provided four kinds of slits here. That is, two kinds of slits, the upper slit A and the upper slit B longer than the upper slit A are provided as an upper slit, and two kinds of slits, the lower slit C and the lower slit D shorter than the lower slit C are provided as a lower slit.

At this time, it is preferable that the upper slit A and the lower slit D are designed so that it may have a length shorter than 50% of a length from the upper end to the lower end of the cylindrical heat generating part of the graphite heater. Thereby, the heat generating slit part formed by the upper slit A and the lower slit C opposed to it can be located at the upper side of the central line dividing the heat generating part in a height direction to the upper part and the lower part. And, the heat generating slit part formed by the lower slit D and the upper slit B opposed to it can be located at the lower side of the central line dividing the heat generating part in a height direction to the upper part and the lower part.

Furthermore, each slit is periodically formed in a circumferential direction, the heat generating distribution of the heat generating part is such that the high temperature part and the low temperature part may be periodically distributed in a circumferential direction and one cycle may be 180°. Moreover, the cycle based on the upper slit and the cycle based on the lower slit are shifted by 90° in the circumferential direction so that the heat generating distributions may be shifted 90° between the upper side and the lower side of the central line dividing the heat generating part in a height direction to the upper part and the lower part.

The cycle based on the upper slit and the cycle based on the lower slit are preferably shifted by 45° or more and 135° or less in the circumferential direction. If they are in the range, a lengthwise convection in a direction from a bottom of a crucible to a surface of a raw material melt can be surely promoted further to a helical direction.

Figure 2:
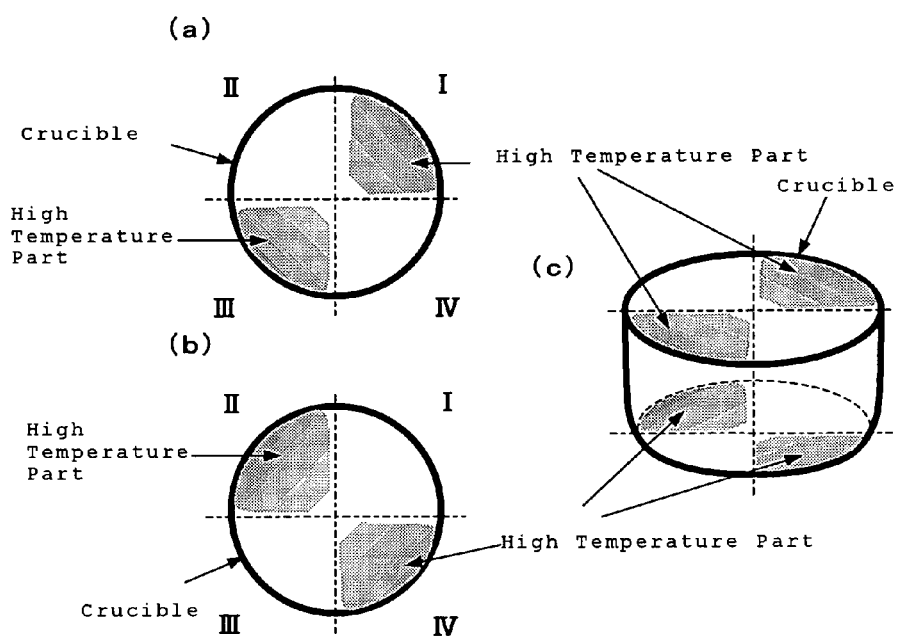
FIG. 2 is a conceptual view showing a temperature distribution of the raw material melt in a crucible when heating a crucible by the graphite heater shown in FIG. 1.
(a) a temperature distribution on the surface side of the raw material melt,
(b) a temperature distribution of the raw material melt on the side of a bottom of the crucible,
(c) a temperature distribution of the whole raw material melt.

The temperature distribution of the raw material melt contained in the crucible when being heated by such a graphite heater is shown in FIG. 2. As shown in FIG. 2(a), the heat generating slit part formed of the upper slit A and the lower slit C plays a role of heating the part near the surface of the raw material melt which corresponds to the 1st quadrant and the 3rd quadrant when the crucible is seen from right above. On the other hand, as shown in FIG. 2(b), the heat generating slit part formed of the upper slit B and the lower slit D plays a role of heating the bottom of the crucible and the R part of the crucible which corresponds to the 2nd quadrant and the 4th quadrant. Therefore, the raw material melt in the crucible has the temperature distribution as shown in FIG. 2(c) as a whole.

Such a temperature distribution in the raw material melt promotes a convection in the raw material melt to a lengthwise direction from a bottom of a crucible to a surface of the raw material melt, and further to a helical direction, as a result. Thereby, a convection of directly under a single crystal solid-liquid interface which generates secondarily is promoted, and the temperature gradient (G) near the single crystal solid-liquid interface is raised. Therefore, the form of a single crystal solid-liquid interface can be easily changed to an upper convex form, and OSF is extinguished in a higher growing rate region. For example, the crystal of N region can be pulled at high speed.

Moreover, since a conventional graphite heater has a heat generating part having an heat generating distribution uniform in a circumferential direction, a control of an oxygen concentration in a single crystal by changing a convection of a raw material melt, can be performed only by changing a relative position in height of a crucible and a graphite heater. However, according to the present invention, since the heat generating distribution of the heat generating part of a graphite heater itself can be variously changed according to the purpose, the convection of a raw material melt can also be changed freely and an oxygen concentration in a single crystal can also be controlled freely.

In addition, a periodic distribution of the circumferential direction of the heat generating part can be made not only by changing a length of a slit as mentioned above, but also by changing one or more of a wall thickness of the heat generating slit part, a width of the heat generating slit part, a length of a slit, and a material of the heat generating slit part.

Moreover, it is preferable that a shift of the cycle of the heat generating distribution between an upper side and a lower side of a central line dividing the heat generating part in a height direction to the upper part and the lower part is in the range of 45° or more and 135° or less. If it is in the range, a convection generated lengthwise from the bottom of the crucible to the surface of the raw material melt in the raw material melt can be promoted to a helical direction effectively by heating a bottom of the crucible or an R part of the crucible.

Furthermore, the present invention provides an apparatus for producing a crystal equipped with the above-mentioned graphite heater for producing a crystal, and a method for producing a single crystal according to the Czochralski method using the apparatus for producing a crystal. According to the present invention, a single crystal in a desired defect-free region such as N region, or a desired defect range can be pulled up at high speed, only by setting the heater which has the above-mentioned characteristics in an apparatus for producing a single crystal which has a conventional structure in a furnace. Thereby, productivity can be improved. Moreover, since change of a design of an existing equipment or the like is not necessary, it can be constituted very easily and cheaply.

In the 2nd embodiment of the present invention, the graphite heater of the present invention is not like a conventional heater wherein a heat generating distribution of a heat generating part is uniform over a circumferential direction, but is a heater designed so that one graphite heater may have a peak of a heat generating distribution at an upper part of the crucible, and/or at a bottom of the crucible and an R part of the crucible, and may have an uneven temperature distribution. Furthermore, it is designed so that the heat generating power to the bottom of the crucible and the R part of the crucible may be higher than the heat generating power to the upper part of the crucible.

One example of the graphite heater of the present invention is shown in FIG. 5. In this graphite heater, upper slits extending downward from the upper end of the heat generating part 28 and lower slits extending upwards from the lower end of the heat generating part are provided by turns so that the electric current way of the electric current applied from the terminal part 27 may serve as a zigzag configuration in the vertical direction in the heat generating part 28. The heat generating distribution of the heat generating part is changed by changing a size and an arrangement of these slits. Therefore, there are provided four kinds of slits here. That is, two kinds of slits, the upper slit A2 and the upper slit B2 longer than the upper slit A2 are provided as an upper slit, and two kinds of slits, the lower slit C2 and the lower slit D2 shorter than the lower slit C2 are provided as a lower slit.

It was designed so that the number of the lower slit D2 may be more than the number of the upper slit A2. It is preferable to design so that the number of the lower slit D2 may be in the range that twice to five times of the number of the upper slit A2. If it is twice or more, a lengthwise convection from a bottom of a crucible to a surface of a raw material melt can be efficiently promoted, since a bottom of a crucible or an R part of a crucible is heated strongly. As a result, the effect of raising a temperature gradient (G) near the solid-liquid interface of a pulling single crystal can be achieved. On the other hand, it is sufficient if it is five times. If it is more, a temperature gradient (G) near the solid-liquid interface cannot be sufficiently raised in some cases since the upper part of a crucible is heated weekly. Furthermore, a convection becomes too large, a temperature gradient (G) near the solid-liquid interface in a crystal becomes ununiform in a radial direction, and a growing rate of a single crystal cannot be controlled stably in some cases, since a bottom of a crucible or an R part of a crucible is heated more strongly.

At this time, it is preferable that the upper slit A2 and the lower slit D2 are designed so that they may have a length shorter than 50% of a length from the upper end to the lower end of the cylindrical heat generating part of a graphite heater. Moreover, it is preferable that the upper slit B2 and the lower slit C2 are designed so that they may have a length of 70% or longer of a length from the upper end to the lower end of the cylindrical heat generating part of a graphite heater. Thereby, the heat generating slit part formed by the upper slit A2 and the lower slit C2 opposed to it can be located at the upper side of the central line dividing the heat generating part in a height direction to the upper part and the lower part. Moreover, the heat generating slit part formed by the lower slit D2 and the upper slit B2 opposed to it can be located at the lower side of the central line dividing the heat generating part in a height direction to the upper part and the lower part.

Furthermore, each slit is periodically formed in a circumferential direction, and the heat generating distribution of the heat generating part is such that the high temperature part and the low temperature part may be periodically distributed in a circumferential direction and one cycle may be 180°. Moreover, the cycle based on the upper slit and the cycle based on the lower slit are shifted by 135° in the circumferential direction so that the heat generating distributions may be shifted 135° between the upper side and the lower side of the central line dividing the heat generating part in a height direction to the upper part and the lower part.

The cycle based on the upper slit and the cycle based on the lower slit are preferably shifted by 45° or more and 135° or less. If they are in the above-mentioned range, a lengthwise convection in a direction from a bottom of a crucible to a surface of a raw material melt can be surely promoted further to a helical direction.

Figure 6:
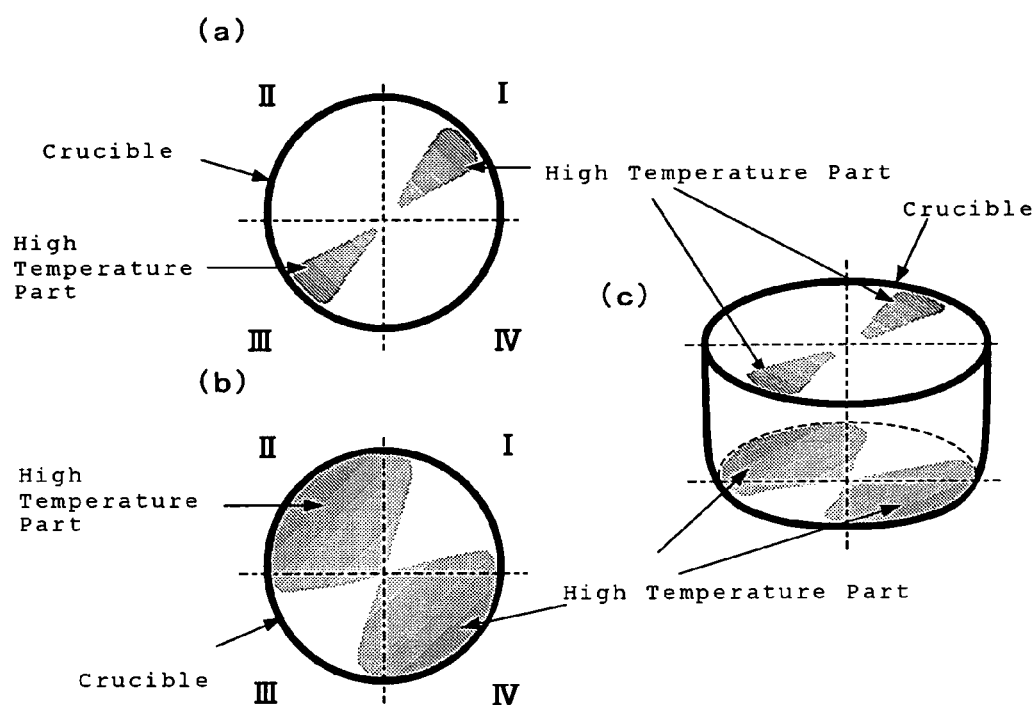
FIG. 6 is a explanatory view showing a temperature distribution of the raw material melt in a crucible when heating the crucible by the graphite heater shown in FIG. 5.
(a) a temperature distribution on the surface side of the raw material melt,
(b) a temperature distribution of the raw material melt on the side of a bottom of the crucible,
(c) a temperature distribution of the whole raw material melt.

The temperature distribution of the raw material melt contained in a crucible when being heated by such a graphite heater is shown in FIG. 6. As shown in FIG. 6(a), the heat generating slit part formed of the upper slit A2 and the lower slit C2 plays a role of heating the part near the surface of the raw material melt at a part of the part corresponding to the 1st quadrant and the 3rd quadrant when the crucible is seen from right above. On the other hand, as shown in FIG. 6(b), the heat generating slit part formed of the upper slit B2 and the lower slit D2 plays a role of heating a bottom of a crucible and an R part of a crucible which corresponds to the 2nd quadrant and the 4th quadrant in addition to a part of the 1st quadrant and the 3rd quadrant. Therefore, the raw material melt in the crucible has a temperature distribution as shown in FIG. 6(c) as a whole.

Such a temperature distribution in the raw material melt promotes a convection in the raw material melt to a lengthwise direction from a bottom of a crucible to a surface of a raw material melt, and further to a helical direction, as a result. Thereby, a convection directly under a single crystal solid-liquid interface which generates secondarily is promoted, and the temperature gradient (G) near the single crystal solid-liquid interface is raised. Therefore, the form of a single crystal solid-liquid interface can be more easily changed to an upper convex form and OSF is extinguished in a higher growing rate region. For example, the crystal of N region can be pulled at high speed.

Moreover, since a conventional graphite heater has an heat generating part having an heat generating distribution uniform in a circumferential direction, a control of an oxygen concentration in a single crystal by changing a convection of a raw material melt, can be performed only by changing a relative position in height between a crucible and a graphite heater. However, according to the present invention, since the heat generating distribution of the heat generating part of the graphite heater itself can be variously changed according to the purpose, the convection of a raw material melt can also be changed freely and an oxygen concentration in a single crystal can also be controlled freely.

Furthermore, the present invention provides an apparatus for producing a crystal equipped with the above-mentioned graphite heater for producing a crystal, and a method for producing a single crystal according to the Czochralski method using the apparatus for producing a crystal. According to the present invention, a single crystal in a desired defect-free region such as N region, or a desired defect region can be pulled at high speed, only by setting the heater which has the above-mentioned characteristics in an apparatus for producing a single crystal which has a conventional structure in a furnace, and thereby productivity can be improved. Moreover, since change of a design of an existing equipment or the like is not necessary, it can be constituted very easily and cheaply.

Next, in the 3rd embodiment of the present invention, the graphite heater of the present invention is not like a conventional heater wherein a heat generating distribution of a heat generating part is uniform over the circumferential direction, but is a heater designed so that one graphite heater may have a peak of a heat generating distribution at an upper part of a crucible, and/or a bottom of a crucible and an R part of a crucible, and may have an uneven temperature distribution.

Figure 10:
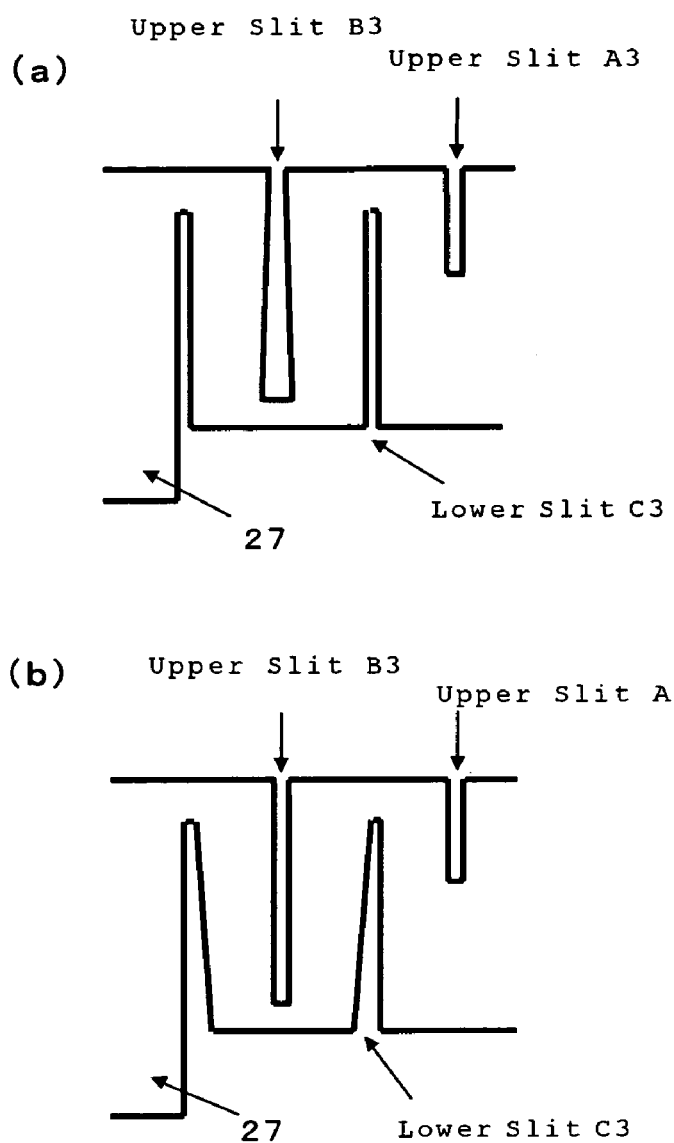
FIG. 10 is an enlarged view showing a slit of the graphite heater of the present invention.
(a) a heater wherein a width of the lower end of the upper slit B3 is larger than a width of the upper end thereof,
(b) a heater wherein a width of the lower end of the lower slit C3 is larger than a width of the upper end thereof.

One example of the graphite heater of the present invention is shown in FIG. 9 and FIG. 10. In this graphite heater, upper slits extending downward from the upper end of the heat generating part 28 and lower slits extending upwards from the lower end of the heat generating part are provided by turns so that the electric current way of the electric current applied from the terminal part 27 may serve as a zigzag configuration in the vertical direction in the heat generating part 28. The heat generating distribution of the heat generating part is changed by changing a size and an arrangement of these slits. Therefore, there are provided three kinds of slits here. That is, two kinds of slits, the upper slit A3 and the upper slit B3 longer than the upper slit A3 were provided as an upper slit, and the lower slit C3 was provided as a lower slit.

Furthermore, it is designed so that the width of the lower end of the upper slit B3 may be wider than the width of the upper end thereof (see FIG. 10(a)), and/or the width of the lower end of the lower slit C3 may be wider than the width of the upper end thereof (see FIG. 10(b)). At this time, it is preferable that a width of the lower end of the upper slit B3 is designed so that it may have a width of not less than 1.5 times and not more than 2.5 times of a width of the upper end thereof, and that a width of the lower end of the lower slit C3 is not less than 1.5 times and not more than 2.5 times of a width of the upper end thereof. If it is not less than 1.5 times, a lengthwise convection in a direction from a bottom of a crucible to a surface of a raw material melt in the raw material melt can be effectively promoted by a concentrated heating effect to the bottom of the crucible and the R part of the crucible, and thereby the effect of raising a temperature gradient (G) near the pulling single crystal solid-liquid interface can be achieved. On the other hand, if it is not more than 2.5 times, a space between the adjacent slits can be sufficient, a heat generating power of the graphite heater is adequate, and thus the graphite material of the heater can be prevented from being degraded due to heat of itself and lifetime of the graphite heater can be prolonged. Furthermore, if it is in the above-mentioned range, a temperature gradient (G) near the solid-liquid interface in a crystal can be made almost uniform in a radial direction, since a convection is adequate. Accordingly, the production margin in a predetermined defect free region such as N region can be enlarged, and thus a single crystal in a predetermined defect free region can be stably produced at high speed.

At this time, it is preferable that the upper slit A3 is designed so that it may have a length shorter than 50% of a length from the upper end to the lower end of the cylindrical heat generating part of the graphite heater. It is preferable that the upper slit B3 is designed so that it may have a length of 70% or longer of a length from the upper end to the lower end of the cylindrical heat generating part of the graphite heater. Thereby, the heat generating slit part formed by the upper slit A3 and the lower slit C3 opposed to it can be located at the upper side of the central line dividing the heat generating part in a height direction to the upper part and the lower part. Moreover, a heat generating center of the heat generating slit part formed by the upper slit B3 and the lower slit C3 opposed to it can be located at the lower side of the central line dividing the heat generating part in a height direction to the upper part and the lower part, since a width of the lower side of the heat generating slit part is narrower than a width of the upper side thereof.

Furthermore, each slit is periodically formed in a circumferential direction, and the heat generating distribution of the heat generating part is such that the high temperature part and the low temperature part may be periodically distributed in a circumferential direction and one cycle may be 180°. Moreover, the heat generating distributions of the heat generating part of the graphite heater may be shifted 90° between the upper side and the lower side of the central line dividing the heat generating part in a height direction to the upper part and the lower part.

Figure 11:
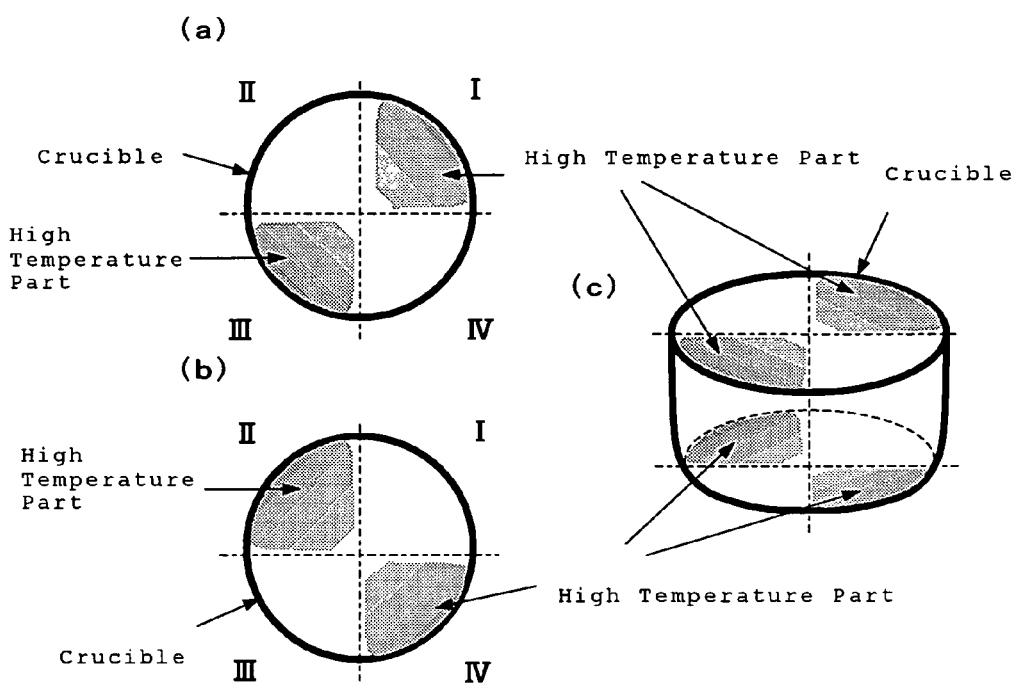
FIG. 11 is a conceptual view showing a temperature distribution of the raw material melt in a crucible when heating the crucible by the graphite heater shown in FIG. 9.
(a) a temperature distribution on the surface side of the raw material melt,
(b) a temperature distribution of the raw material melt on the side of a bottom of the crucible,
(c) a temperature distribution of the whole raw material melt.

The temperature distribution of the raw material melt contained in a crucible when being heated by such a graphite heater is shown in FIG. 11. As shown in FIG. 11($a$), the heat generating slit part formed of the upper slit A3 and the lower slit C3 plays a role of heating the part near a surface of a raw material melt which corresponds to the 1st quadrant and the 3rd quadrant when crucible is seen from right above. On the other hand, as shown in FIG. 11($b$), a heat generating center of the heat generating slit part formed of the upper slit B3 and the lower slit C3 plays a role of heating the part of a bottom of a crucible and an R part of a crucible which corresponds to the 2nd quadrant and the 4th quadrant. Therefore, the raw material melt in the crucible has a temperature distribution as shown in FIG. 11($c$) as a whole.

Such a temperature distribution in the raw material melt promotes a convection in the raw material melt to a lengthwise direction from a bottom of a crucible to a surface of the raw material melt, and further to a helical direction, as a result. Thereby, a convection of directly under a single crystal solid-liquid interface which generates secondarily is promoted, and the temperature gradient (G) near the single crystal solid-liquid interface is raised. Therefore, the form of a single crystal solid-liquid interface can be more easily changed to an upper convex form, and OSF is extinguished in a higher growing rate region. For example, the crystal of N region can be pulled at high speed.

Moreover, since a conventional graphite heater has a heat generating part having a heat generating distribution uniform in a circumferential direction, a control of an oxygen concentration in a single crystal by changing a convection of a raw material melt, can be performed only by changing a relative position in height direction between a crucible and a graphite heater. However, according to the present invention, since a heat generating distribution of the heat generating part of the graphite heater itself can be variously changed according to the purpose, the convection of a raw material melt can also be changed freely and an oxygen concentration in a single crystal can also be controlled freely.

Furthermore, the present invention provides an apparatus for producing a crystal equipped with the above-mentioned graphite heater for producing a crystal, and a method for producing a single crystal according to the Czochralski method using the apparatus for producing a crystal. According to the present invention, a single crystal in a desired defect-free region such as N region, or a desired defect range can be pulled at high speed, only by setting the heater which has the above-mentioned characteristics in an apparatus for producing a single crystal which has a conventional structure in a furnace. Thereby productivity can be improved. Moreover, since change of a design of an existing equipment or the like is not necessary, it can be constituted very easily and cheaply.

In the 4th embodiment of the present invention, the graphite heater of the present invention is not like a conventional heater wherein a heat generating distribution of a heat generating part is uniform over the circumferential direction, but is a heater designed so that one graphite heater may have the peak of a heat generating distribution at an upper part of a crucible, and/or at the bottom of a crucible and an R part of a crucible. Further, it is designed so that a heat generating power to the upper part of the crucible may be larger than a heat generating power to the bottom part of the crucible or the R part of the crucible.

One example of the graphite heater of the present invention is shown in FIG. 14. This graphite heater has established by turns the upper slits prolonged downward from the upper end of the heat generating part 28 and the lower slits prolonged upwards from the lower end of the heat generating part so that the electric current way of the electric current applied from the terminal part 27 may serve as a zigzag configuration in the vertical direction in the heat generating part 28. And the size and arrangement of these slits were changed and the heat generating distribution of the heat generating part is changed. Therefore, four kinds of slits are provided here. That is, two kinds of slits, the upper slit A4 and the upper slit B4 longer than the upper slit A4 are provided as an upper slit, and two kinds of slits, the lower slit C4 and the lower slit D4 shorter than the lower slit C4 are provided as an lower slit.

Furthermore, it is designed that the number of the upper slit A4 may be more than the number of the lower slit D4. It is preferable that the number of the upper slit A4 is designed so that it may have a number of not less than 1.5 times and not more than 5 times of the umber of the lower slit D4. If it is not less than 1.5 times, an oxygen concentration in a radial direction of a single crystal to be produced can be further uniform, and thus the wafer produced from the single crystal has an excellent gettering capacity which is uniform in plane. Furthermore, the temperature gradient (G) near the solid-liquid interface in a crystal can be made almost uniform in a radial direction, since the upper part of the crucible can be heated sufficiently. On the other hand, if it is not more than 5 times, the lower part of the crucible can be heated sufficiently, and a lengthwise convection in a direction from a bottom of a crucible to a surface of a raw material melt can be effectively promoted. Thereby, the effect of raising a temperature gradient (G) near the pulling single crystal solid-liquid interface can be achieved.

At this time, it is preferable that the upper slit A4 and the lower slit D4 are designed so that they may have a length shorter than 50% of a length from the upper end to the lower end of the cylindrical heat generating part of the graphite heater. And, it is preferable that the upper slit B4 and the lower slit C4 are designed so that they may have a length of 70% or longer of a length from the upper end to the lower end of the cylindrical heat generating part of the graphite heater. Thereby, the heat generating slit part formed by the upper slit A4 and the lower slit C4 opposed to it can be located at the upper side of the central line dividing the heat generating part in a height direction to the upper part and the lower part. Moreover, the heat generating slit part formed by the lower slit D4 and the upper slit B4 opposed to it can be located at the lower side of the central line dividing the heat generating part in a height direction to the upper part and the lower part.

In addition, it is more preferable that the upper slit A4 is designed so that it may have a length of 20%-40% of a length from the upper end to the lower end of a cylindrical heat generating part of a graphite heater. Thereby, a uniformity of an oxygen concentration in a radial direction of a crystal can be further improved.

Furthermore, each slit is periodically formed in a circumferential direction, and the heat generating distribution of the heat generating part is such that the high temperature part and the low temperature part may be periodically distributed over the circumferential direction, and one period may become 180°. Moreover, for example, the cycle based on the upper slit and the cycle based on the lower slit are shifted by 105° in the circumferential direction so that the heat generating distributions may be shifted 105° between the upper side and the lower side of the central line dividing the heat generating part in a height direction to the upper part and the lower part.

The cycle based on the upper slit and the cycle based on the lower slit are preferably shifted by 45° or more and 135° or less in the circumferential direction. If they are in the range, a lengthwise convection in a direction from a bottom of a crucible to a surface of a raw material melt can be surely promoted further to a helical direction.

The temperature distribution of the raw material melt accommodated in a crucible when being heated at such a graphite heater is shown in FIG. 15. As shown in FIG. 15(a), the heat generating slit part formed of the upper slit A4 and the lower slit C4 plays a role of heating the part near the surface of the raw material melt which corresponds to a part of the 1st quadrant to the 2rd quadrant and a part of the 3rd quadrant to the 4th quadrant when a crucible is seen from right above. On the other hand, as shown in FIG. 15(b), the heat generating slit part formed of the upper slit B4 and the lower slit D4 plays a role of heating a bottom of a crucible and an R part of a crucible which corresponds to a part of the 1st quadrant to the 4th quadrant and a part of the 2nd quadrant to the 3rd quadrant. Therefore, the raw material melt in a crucible serves as an uneven temperature distribution as shown in FIG. 15(c) as a whole, and a heat generating power to the upper part of the crucible is larger than a heat generating power to the lower part of the crucible.

Such a temperature distribution in a raw material melt promotes a convection in the raw material melt to a lengthwise direction from a bottom of a crucible to a surface of a raw material melt, and further to a helical direction, as a result. Thereby, a convection of directly under a single crystal solid-liquid interface which generates secondarily is promoted, and the temperature gradient (G) near the solid-liquid interface of a single crystal is raised. Thus, a form of a single crystal solid-liquid interface may be more easily changed to an upper convex form. Moreover, OSF is extinguished in the higher growing rate region, and for example, the crystal in N region can be pulled at high speed.

Moreover, since a conventional graphite heater has a heat generating part having a heat generating distribution uniform in a circumferential direction, a control of an oxygen concentration in a single crystal by changing a convection of a raw material melt, can be performed only by changing a relative relation of a position in a height direction between a crucible and a graphite heater. However, according to the present invention, since the heat generating distribution of the heat generating part of the graphite heater itself can be variously changed according to the purpose, a convection of a raw material melt can also be changed freely and an oxygen concentration in a single crystal can also be controlled freely.

Furthermore, an oxygen concentration can be highly uniform in the radial direction of the crystal in the single crystal to be produced, and the wafer produced from the single crystal has an excellent gettering capacity which is uniform in plane.

Furthermore, the present invention provides an apparatus for producing a crystal equipped with the above-mentioned graphite heater for producing a crystal, and a method for producing a single crystal according to the Czochralski method using the apparatus for producing a crystal. According to the present invention, a single crystal in a desired defect-free region such as N region, or a desired defect region can be pulled at high speed, and an oxygen concentration in a radial direction of a single crystal can be controlled almost uniform, only by setting the heater which has the above-mentioned characteristics in an apparatus for producing a single crystal which has a conventional structure in a furnace, and thereby productivity can be improved. Moreover, since change of a design of an existing equipment or the like is not necessary, it can be constituted very easily and cheaply.

Hereafter, the present invention will be explained concretely by referring to Examples and Comparative Examples.

EXAMPLE 1

The silicon single crystal was produced using the apparatus for producing a single crystal shown in FIG. 19. To the quartz crucible with a diameter of 24 inches (600 mm) was charged 150 kg of polycrystal silicon as a raw material, and the silicon single crystal with a diameter of 8 inches (200 mm) and an orientation <100> was pulled. When pulling a single crystal, a growing rate was controlled so that it may dwindle from a head to a bottom of a crystal in the range of 0.7 mm/min to 0.3 mm/min. Moreover, the silicon single crystal was produced so that an oxygen concentration might be 22-23 ppma (ASTM'79).

The graphite heater shown in FIG. 1 was used. That is, the full length of the heat generating part of this graphite heater is 600 mm, and four upper slits A, six upper slits B, eight lower slits C and four lower slits D are provided therein. The upper slit A and the lower slit D have a length of 250 mm respectively, and the upper slit B and the lower slit C have a length of 500 mm respectively.

The silicon single crystal produced in this way was investigated as for OSF, FPD, LEP, and Cu deposition.

That is, wafers were cut out at every 10 cm from the position where a rate of solidification of the crystal was about 10% or more (from the position where the straight body of the crystal is 10 cm or more in the case of the conditions of this Example), and subjected to a surface grinding and polishing, and then investigated as follows.

(a) Investigation of FPD (V Region) and LEP (I Region):

The density in plane of sample was measured after Secco etching for 30 minutes (without agitating).

(b) Investigation of an OSF Region:

The density in plane of sample was measured after heat treatment for 100 minutes at 1100° C. in an atmosphere of Wet-$O_2$.

Figure 3:
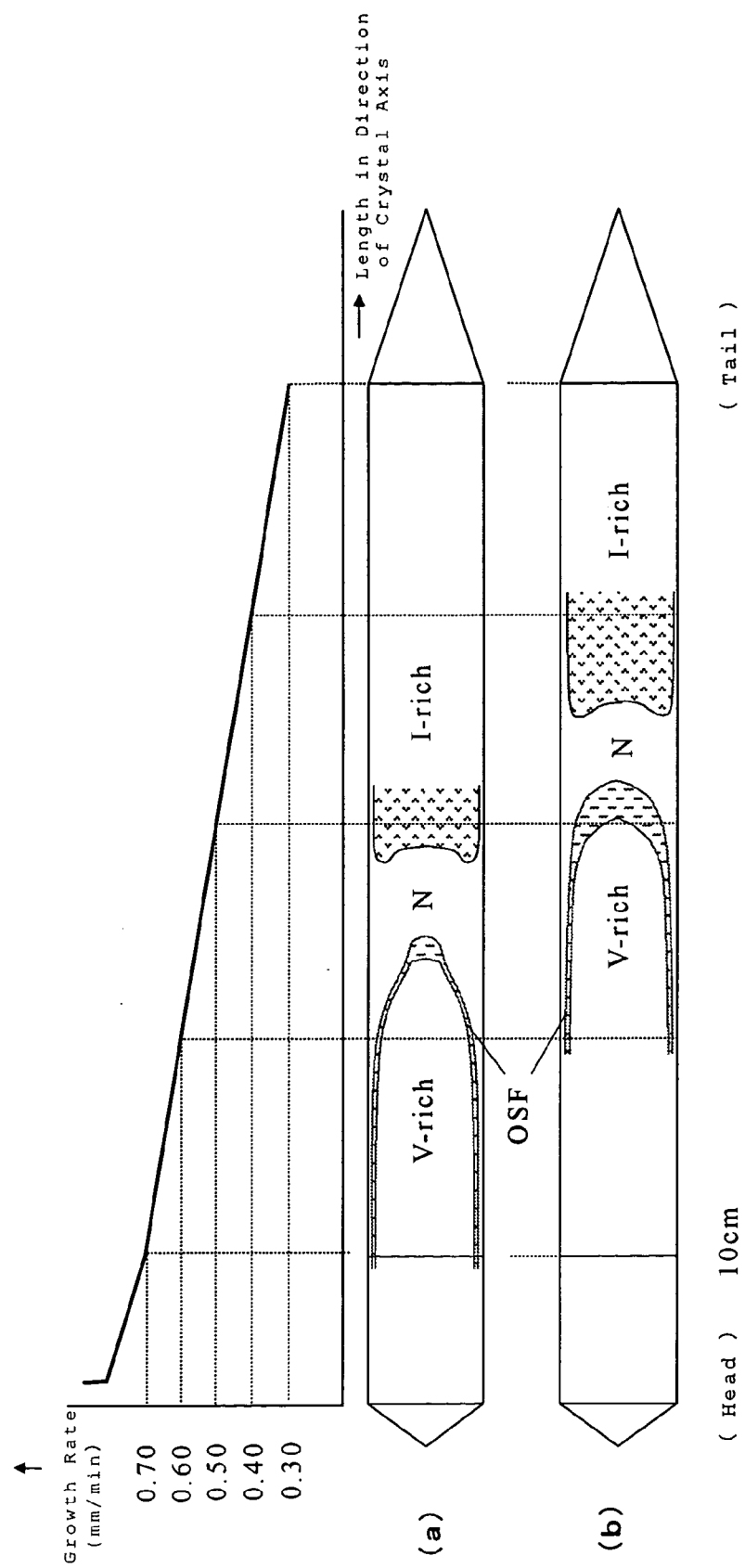
FIG. 3 is an explanatory view showing a growing rate of a single crystal, and a crystal-defect distribution.
(a) Example 1, (b) Comparative Example 1.

(c) Investigation of the Defect by Cu Deposition Treatment:

The treatment is as follows:

1) oxide-film: 25 nm
2) electric-field strength: 6 MV/cm
3) time of applying voltage: 5 minutes As a result, the distribution of each region was as shown in FIG. 3(*a*). That is, a growing rate at each boundary of the regions was as follows.

The growing rate at a boundary between the V region and the OSF region=0.56 mm/min.

The growing rate at a boundary between the OSF region and the N region where defects were detected by Cu deposition treatment=0.55 mm/min.

The growing rate at a boundary between the N region where the defects were detected by Cu deposition treatment and the N region where a defect was not detected by Cu deposition treatment=0.54 mm/min.

The growing rate at a boundary between the N region where a defect was not detected by Cu deposition treatment and the I region=0.52 mm/min.

Figure 4:
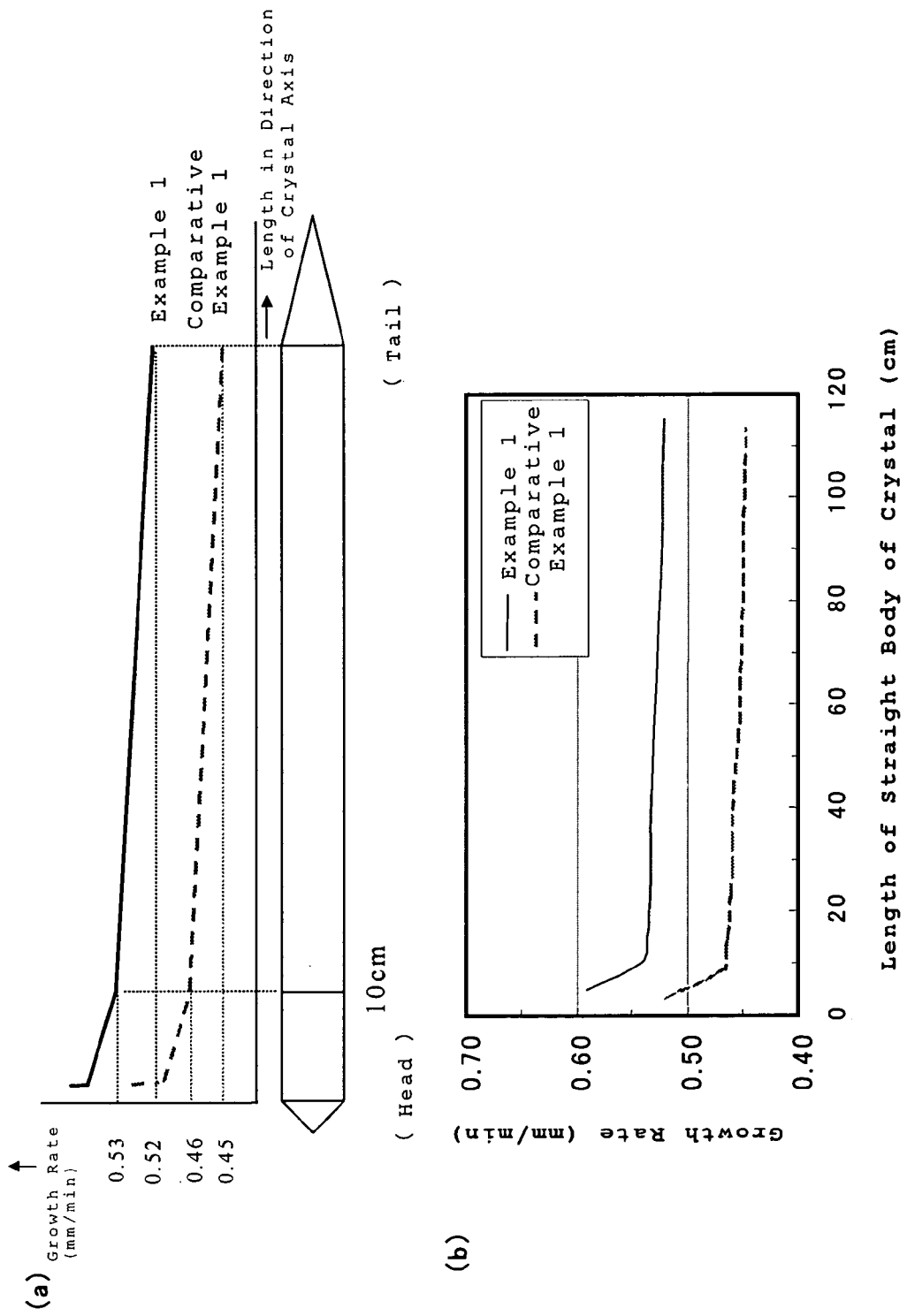
FIG. 4 is a comparative view comparing Example 1 and Comparative Example 1 when a silicon single crystal is grown with controlling a growing rate in N region in which defect is not detected by Cu deposition treatment ((a), (b)). The growing rate of the N region has been found by studying a relation of a growing rate of a single crystal and a crystal-defect distribution.

Next, based on the above results, the silicon single crystal was pulled with controlling a growing rate in 0.53-0.52 mm/min from 10 cm of the straight body to a tail part of the straight body, intending N region where a defect was not detected by Cu deposition treatment (see FIGS. 4(*a*) and (*b*)). The pulled silicon single crystal was processed to provide a mirror-finihed wafer. Then, oxide dielectric breakdown voltage characteristic thereof was evaluated. The conditions of C mode measurement are as follows.

1) Oxide-film: 25 nm
2) measurement electrodes: phosphorus doped poly silicon
3) electrode area: 8 mm$^2$
4) current density in decision: 1 mA/cm$^2$ As a result, oxide dielectric breakdown voltage level was a good chip yield of 100%.

COMPARATIVE EXAMPLE 1

The graphite heater shown in FIG. 20 was used. This graphite heater has a heat generating part with a full length of 600 mm, and ten upper slits and twelve lower slits are provided therein. All of the upper slits have a length of 500 mm, and all of the lower slits have a length of 500 mm. The silicon single crystal was produced under the same conditions as Example 1 except that the above-mentioned graphite heater was used. OSF, FPD, LEP, and Cu deposition were investigated in a similar manner to Example 1.

As a result, the distribution in each region was as shown in FIG. 3(*b*). That is, a growing rate of each boundary of the regions was as follows.

A growing rate at the boundary between the V region and the OSF region=0.50 mm/min.

A growing rate at the boundary between the OSF region and the N region where defects were detected by Cu deposition treatment=0.48 mm/min.

A growing rate at the boundary between the N region where defects were detected by Cu deposition treatment, and the N region where defects were not detected by Cu deposition treatment=0.47 mm/min.

A growing rate at the boundary between the N region where a defect was not detected by Cu deposition treatment and the I region=0.45 mm/min.

Next, taking the above-mentioned results into consideration, a silicon single crystal was pulled with controlling a growing rate to be 0.46 to 0.45 mm/min from 10 cm of the straight body to a tail part of the straight body, so that the N region where defects were not detected by Cu deposition treatment may be aimed (see FIGS. 4(*a*) and (*b*)). The pulled silicon single crystal was processed into the wafer which was subjected to mirror-finishing, and oxide dielectric breakdown voltage characteristic was evaluated in a similar manner to Example 1.

As a result, oxide dielectric breakdown voltage level was good chip yield of 100%.

FIG. 3 shows distribution of various defects for a growing rate in Example 1 and Comparative Example 1. According to them, it has been found that when pulling a single crystal in N region where a defect was not detected by Cu deposition treatment, it is necessary to grow at a low speed as 0.46-0.45 mm/min in Comparative Example 1, whereas it can be grown at a very high speed as 0.53-0.52 mm/min in Example 1 (see FIG. 4). Therefore, when the graphite heater of the present invention is used, productivity can be improved, and production cost can be lowered.

EXAMPLE 2

The silicon single crystal was produced using the apparatus for a producing single crystal shown in FIG. 19. To quartz crucible with a diameter of 24 inches (600 mm) was charged 150 kg of polycrystal silicon as a raw material, and the silicon single crystal with a diameter of 8 inches (200 mm) and an orientation <100> was pulled. When pulling a single crystal, a growing rate was controlled so that it may dwindle from a head to a bottom of a crystal in the range of 0.7 mm/min to 0.3 mm/min. Moreover, the silicon single crystal was produced so that an oxygen concentration might be 22-23 ppma (ASTM'79).

The graphite heater shown in FIG. 5 was used. That is, the full length of the heat generating part of this graphite heater is 500 mm, and two upper slits A2, eight upper slits B2, four lower slits C2 and eight lower slits D2 are provided therein. The upper slit A2 and the lower slit D2 have a length of 200 mm respectively, and the upper slit B2 and the lower slit C2 have a length of 400 mm respectively.

The silicon single crystal produced in this way was investigated as for OSF, FPD, LEP, and Cu deposition.

That is, wafers were cut out at every 10 cm from the position where a rate of solidification of the crystal was about 10% or more (from the position where the straight body of the crystal is 10 cm or more in the case of the conditions of this Example), and subjected to a surface grinding and polishing, and then investigated as follows.

(a) Investigation of FPD (V Region) and LEP (I Region):

The density in plane of sample was measured after Secco etching for 30 minutes (without agitating).

(b) Investigation of an OSF Region:

The density in plane of sample was measured after heat treatment for 100 minutes at 1100° C. in an atmosphere of Wet-$O_2$.

(c) Investigation of the Defect by Cu Deposition Treatment:

The treatment is as follows:

1) oxide-film: 25 nm
2) electric-field strength: 6 MV/cm
3) time of applying voltage: 5 minutes As a result, the distribution of each region was as shown in FIG. 7(a). That is, a growing rate at each boundary of the regions was as follows.

The growing rate at a boundary between V region and OSF region=0.62 mm/min.

The growing rate at a boundary between OSF region and N region where defects were detected by Cu deposition treatment=0.61 mm/min.

The growing rate at a boundary between N region where the defects were detected by Cu deposition treatment and N region where a defect was not detected by Cu deposition treatment=0.60 mm/min.

The growing rate at a boundary between N region where a defect was not detected by Cu deposition treatment and I region=0.58 mm/min.

Figure 8:
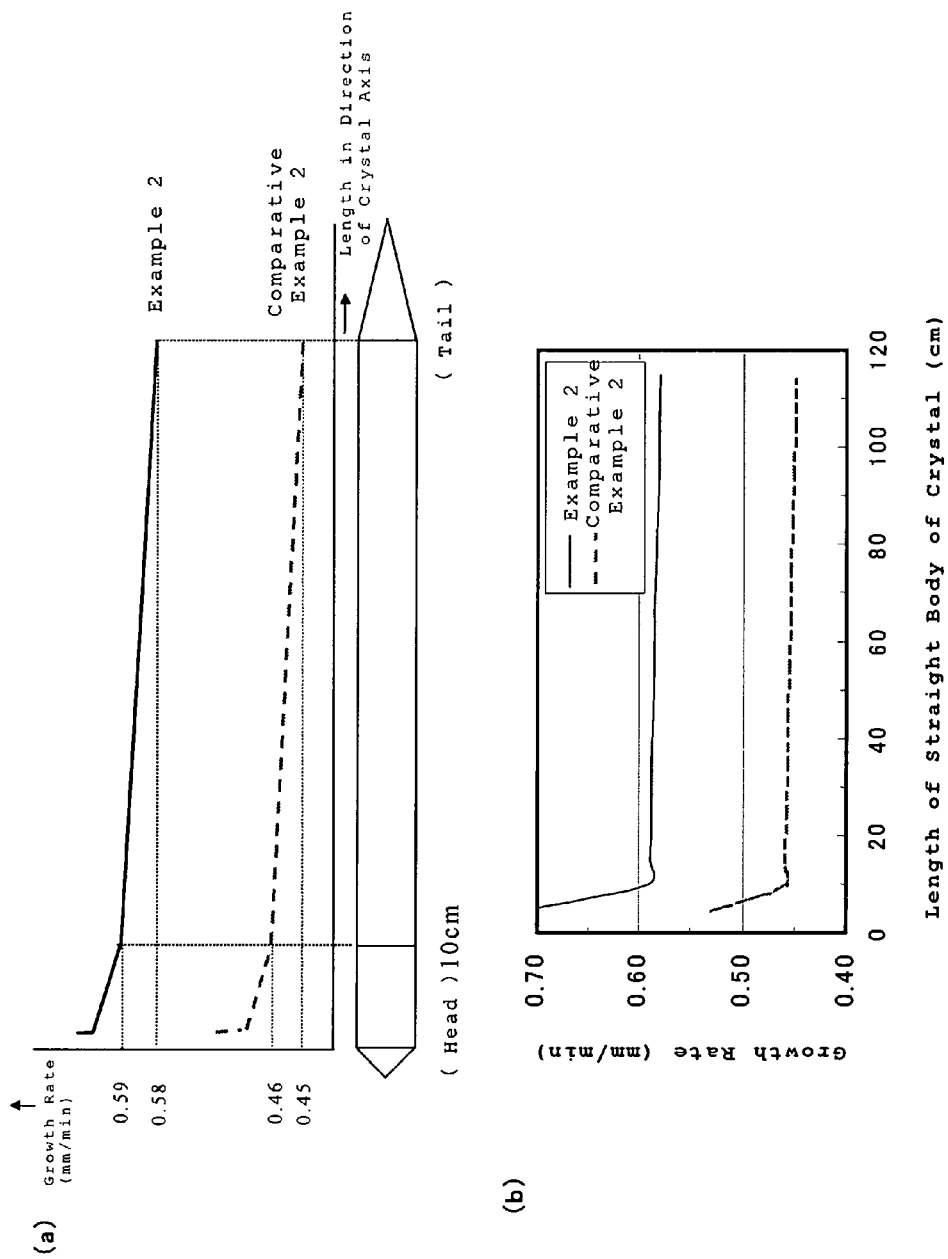
FIG. 8 is a comparative view comparing Example 2 and Comparative Example 2 when a silicon single crystal is grown with controlling a growing rate in N region in which defect is not detected by Cu deposition treatment ((a), (b)). The growing rate of the N region has been found by studying a relation of a growing rate of a single crystal and a crystal-defect distribution.

Next, based on the above results, the silicon single crystal was pulled with controlling a growing rate in 0.59-0.58 mm/min from 10 cm of the straight body to a tail part of the straight body, intending N region where a defect was not detected by Cu deposition treatment (see FIGS. 8(a) and (b)). The pulled silicon single crystal was processed to provide a mirror-finished wafer. Then, oxide dielectric breakdown voltage characteristic thereof was evaluated. The conditions of C mode measurement are as follows.

1) Oxide-film: 25 nm
2) measurement electrodes: phosphorus doped poly silicon
3) electrode area: 8 mm$^2$
4) current density in decision: 1 mA/cm$^2$ As a result, oxide dielectric breakdown voltage level was a good chip yield of 100%.

COMPARATIVE EXAMPLE 2

The graphite heater shown in FIG. 20 was used. This graphite heater has a heat generating part with a full length of 500 mm, and ten upper slits and twelve lower slits are provided therein. All of the upper slits have a length of 400 mm, and all of the lower slits have a length of 400 mm. The silicon single crystal was produced under the same conditions as Example 2 except that the above-mentioned graphite heater was used. OSF, FPD, LEP, and Cu deposition were investigated in a similar manner to Example 2.

As a result, the distribution in each region was as shown in FIG. 7(b). That is, a growing rate of each boundary of the regions was as follows.

A growing rate at the boundary between the V region and the OSF region=0.50 mm/min.

A growing rate at the boundary between the OSF region and the N region where defects were detected by Cu deposition treatment=0.48 mm/min.

A growing rate at the boundary between the N region where defects were detected by Cu deposition treatment, and the N region where defects were not detected by Cu deposition treatment=0.47 mm/min.

A growing rate at the boundary between the N region where a defect was not detected by Cu deposition process and the I region=0.45 mm/min.

Next, taking the above-mentioned results into consideration, a silicon single crystal was pulled with controlling a growing rate to be 0.46 to 0.45 mm/min from 10 cm of the straight body to the tail part of the straight body, so that the N region where defects were not detected by Cu deposition treatment may be aimed (see FIGS. 8(a) and (b)). The pulled silicon single crystal was processed into the wafer which was subjected to mirror-finishing, and oxide dielectric breakdown voltage characteristic was evaluated in a similar manner to Example 2.

As a result, oxide dielectric breakdown voltage level was good chip yield of 100%.

Figure 7:
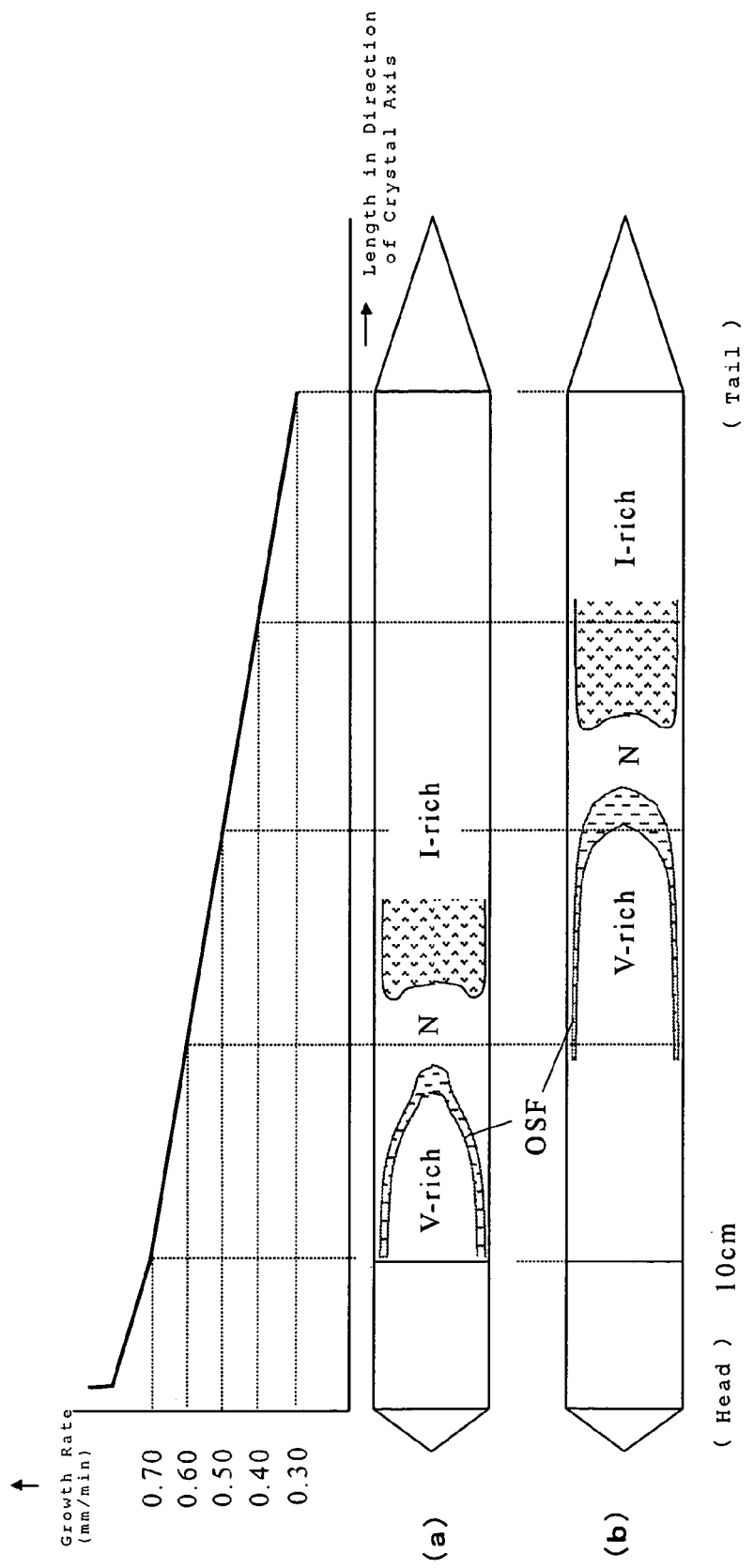
FIG. 7 is an explanatory view showing a growing rate of a single crystal, and a crystal-defect distribution.
(a) Example 2, (b) Comparative Example 2.

FIG. 7 shows distribution of various defects for a growing rate in Example 2 and Comparative Example 2. According to them, it has been found that when pulling a single crystal in N region where a defect was not detected by Cu deposition treatment, it is necessary to grow at a low speed as 0.46-0.45 mm/min in Comparative Example 2, whereas it can be grown at a very high speed as 0.59-0.58 mm/min in Example 2 (see FIG. 7). Therefore, when the graphite heater of the present invention is used, productivity can be improved, and production cost can be lowered.

EXAMPLE 3

The silicon single crystal was produced using the apparatus for producing a single crystal shown in FIG. 19. To the quartz crucible with a diameter of 24 inches (600 mm) was charged 150 kg of polycrystal silicon as a raw material, and the silicon single crystal with a diameter of 8 inches (200 mm) and an orientation <100> was pulled. When pulling a single crystal, a growing rate was controlled so that it may dwindle from a head to a bottom of a crystal in the range of 0.7 mm/min to 0.3 mm/min. Moreover, the silicon single crystal was produced so that an oxygen concentration might be 22-23 ppma (ASTM'79).

The graphite heater shown in FIG. 9 was used. That is, the full length of the heat generating part of this graphite heater is 500 mm, and six upper slits A3, four upper slits B3 and twelve lower slits C3 are provided therein. The upper slit A3 has a length of 200 mm, and the upper slit B3 and the lower slit C3 have a length of 400 mm respectively. The upper slits A3 and the upper slits B3 are designed so that a width may be constant from the upper end to the lower end. On the other hand, as shown in FIG. 10(b), the lower slits C3 were designed so that a width of the lower end may be wider than a width of the upper end. It was designed so that a width of the lower end of the first and the second lower slits C3 from the side of the terminal part (eight in total) may be 1.7 times as wide as a width of the upper end, and a width of the lower end of the remaining lower slits C3 (four in total) may be 2.0 times as wide as a width of the upper end.

The silicon single crystal produced in this way was investigated as for OSF, FPD, LEP, and Cu deposition.

That is, wafers were cut out at every 10 cm from the position where a rate of solidification of the crystal was about 10% or more (from the position where the straight body is 10 cm or more in the case of the conditions of this Example), and subjected to a surface grinding and polishing, and then investigated as follows.

(a) Investigation of FPD (V Region) and LEP (I Region):
The density in plane of sample was measured after Secco etching for 30 minutes (without agitating).

(b) Investigation of an OSF Region:
The density in plane of sample was measured after heat treatment for 100 minutes at 1100° C. in an atmosphere of Wet-$O_2$.

(c) Investigation of the Defect by Cu Deposition Treatment:
The treatment is as follows:
1) oxide-film: 25 nm
2) electric-field strength: 6 MV/cm
3) time of applying viotage: 5 minutes As a result, the distribution of each region was as shown in FIG. 12(a). That is, a growing rate of each boundary of the regions was as follows.

The growing rate at a boundary between the V region and the OSF region=0.63 mm/min.

The growing rate at a boundary between the OSF region and the N region where defects were detected by Cu deposition treatment=0.62 mm/min.

The growing rate at a boundary between the N region where the defects were detected by Cu deposition treatment and the N region where a defect was not detected by Cu deposition treatment=0.61 mm/min.

The growing rate at a boundary between the N region where a defect was not detected by Cu deposition treatment and the I region=0.59 mm/min.

Figure 13:
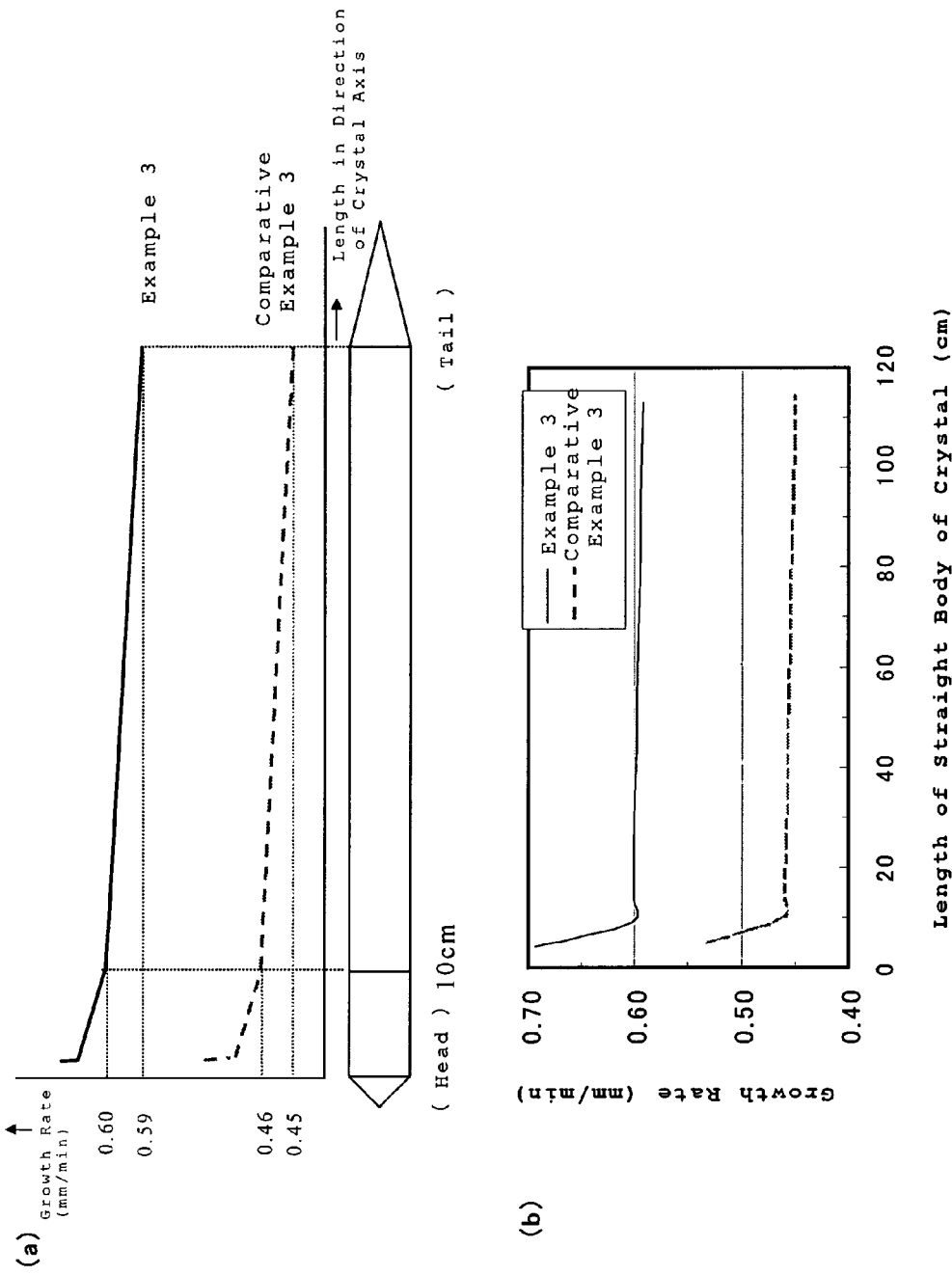
FIG. 13 is a comparative view comparing Example 3 and Comparative Example 3 when a silicon single crystal is grown with controlling a growing rate in N region in which defect is not detected by Cu deposition treatment ((a), (b)).

Next, based on the above results, the silicon single crystal was pulled with controlling a growing rate in 0.60-0.59 mm/min from 10 cm of the straight body to the tail part of the straight body, intending N region where a defect was not detected by Cu deposition treatment (see FIGS. 13(a) and (b)). The pulled silicon single crystal was processed to provide a mirror-finished wafer. Then, oxide dielectric breakdown voltage characteristic thereof was evaluated. The conditions of C mode measurement are as follows.

1) Oxide-film: 25 nm
2) measurement electrodes: phosphorus doped poly silicon
3) electrode area: 8 mm$^2$
4) current density in decision: 1 mA/cm$^2$ As a result, oxide dielectric breakdown voltage level was a good chip yield of 100%.

COMPARATIVE EXAMPLE 3

The graphite heater shown in FIG. 20 was used. This graphite heater has a heat generating part with a full length of 500 mm, and ten upper slits and twelve lower slits are provided therein. All of the upper slits have a length of 400 mm, and are designed so that a width may be constant from the upper end to the lower end. All of the lower slits have a length of 400 mm and are designed so that a width may be constant from the upper end to the lower end. The silicon single crystal was produced under the same conditions as Example 3 except that the above-mentioned graphite heater was used. OSF, FPD, LEP, and Cu deposition were investigated in a similar manner to Example 3.

As a result, the distribution of each region was as shown in FIG. 12(b). That is, a growing rate of each boundary of the regions was as follows.

A growing rate at the boundary between the V region and the OSF region=0.50 mm/min.

A growing rate at the boundary between the OSF region and the N region where defects were detected by Cu deposition treatment=0.48 mm/min.

A growing rate at the boundary between the N region where defects were detected by Cu deposition treatment, and the N region where defects were not detected by Cu deposition treatment=0.47 mm/min.

A growing rate at the boundary between the N region where a defect was not detected by Cu deposition treatment and the I region=0.45 mm/min.

Next, taking the above-mentioned results into consideration, a silicon single crystal was pulled with controlling a growing rate to be 0.46 to 0.45 mm/min from 10 cm of the straight body to the tail part of the straight body, so that the N region where defects were not detected by Cu deposition treatment may be aimed (see FIGS. 13(a) and (b)). The pulled silicon single crystal was processed into the wafer which was subjected to mirror-finishing, and oxide dielectric breakdown voltage characteristic was evaluated in a similar manner to Example 3.

As a result, oxide dielectric breakdown voltage level was good chip yield of 100%.

Figure 12:
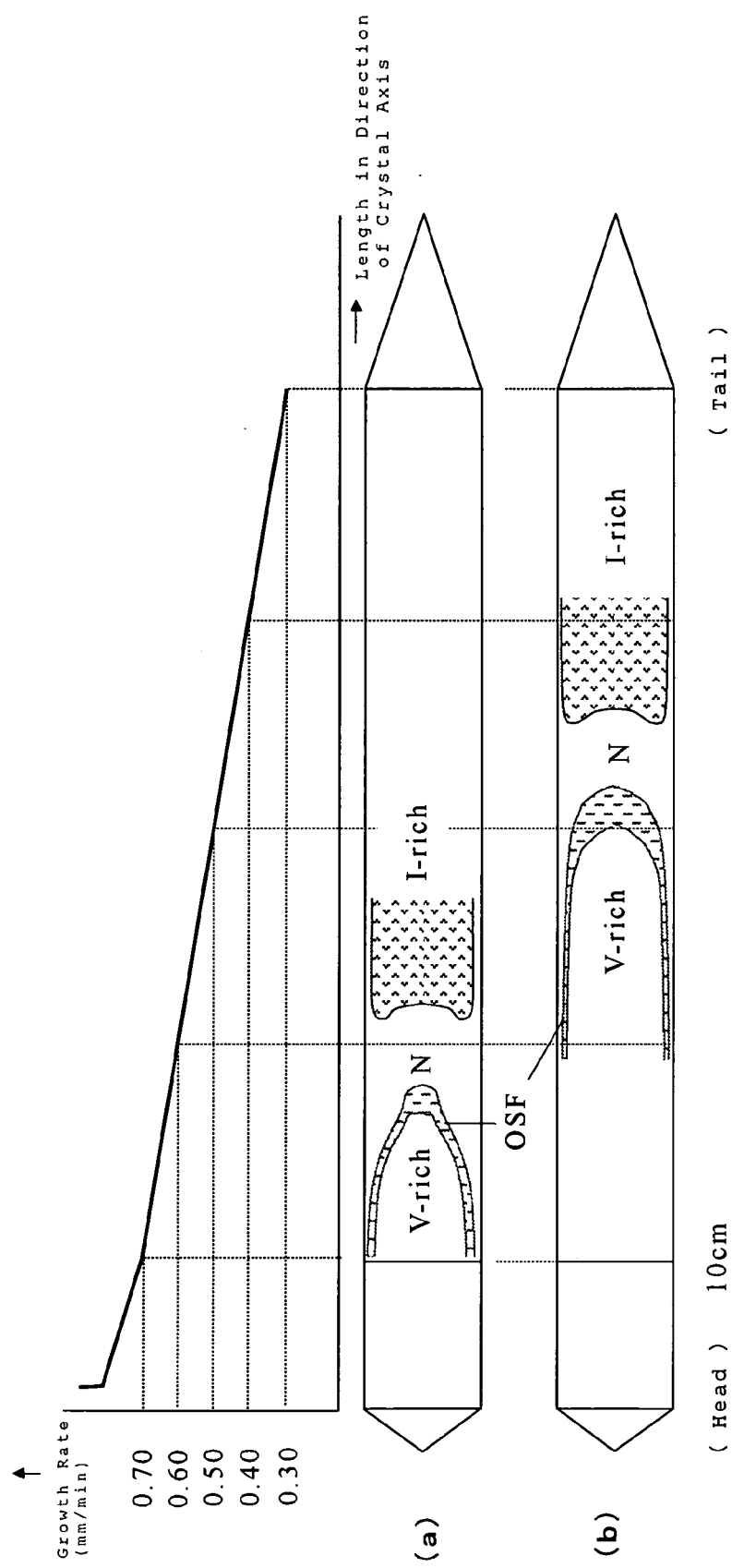
FIG. 12 is an explanatory view showing a growing rate of a single crystal, and a crystal-defect distribution.
(a) Example 3, (b) Comparative Example 3.

FIG. 12 shows distribution of various defects for a growing rate in Example 3 and Comparative Example 3. According to them, it has been found that when pulling a single crystal in N region where a defect was not detected by Cu deposition treatment, it is necessary to grow at a low speed as 0.46-0.45 mm/min in Comparative Example 3, whereas it can be grown at a very high speed as 0.60-0.59 mm/min in Example 3 (see FIG. 13). Therefore, when the graphite heater of the present invention is used, productivity can be improved, and production cost can be lowered.

EXAMPLE 4

The silicon single crystal was produced using the apparatus for producing a single crystal shown in FIG. 19. To the quartz crucible with a diameter of 24 inches (600 mm) was charged 150 kg of polycrystal silicon as a raw material, and the silicon single crystal with a diameter of 8 inches (200 mm) and an orientation <100> was pulled while applying a horizontal magnetic field so as to be 4000G in the core of the crystal. When pulling a single crystal, a growing rate was controlled so that it may dwindle from a head to a bottom of a crystal in the range of 0.7 mm/min to 0.3 mm/min. Moreover, the silicon single crystal was produced so that an oxygen concentration might be 22-23 ppma (ASTM'79).

The graphite heater shown in FIG. 14 was used. That is, the full length of the heat generating part of this graphite heater is 500 mm, and six upper slits A4, four upper slits B4, eight lower slits C4 and four lower slits D4 are provided therein (the number of the upper slits A4/the number of the lower slits D4=1.5). The upper slit A4 and the lower slit D4 have a length of 200 mm respectively, and the upper slit B4 and the lower slit C4 have a length of 400 mm respectively.

The silicon single crystal produced in this way was investigated as for OSF, FPD, LEP, and Cu deposition.

That is, wafers were cut out at every 10 cm from the position where a rate of solidification of the crystal was about 10% or more (from the position where the straight body is 10 cm or more in the case of the conditions of this Example), and subjected to a surface grinding and polishing, and then investigated as follows.

(a) Investigation of FPD (V Region) and LEP (I Region):
The density in plane of sample was measured after Secco etching for 30 minutes (without agitating).

(b) Investigation of an OSF Region:
The density in plane of sample was measured after heat treatment for 100 minutes at 1100° C. in an atmosphere of Wet-$O^2$.

(c) Investigation of the Defect by Cu Deposition Treatment:
The treatment is as follows:
1) oxide-film: 25 nm
2) electric-field strength: 6 MV/cm
3) time of applying voltage: 5 minutes As a result, the distribution of each region was as shown in FIG. 16(a). That is, a growing rate at each boundary of the regions was as follows.

The growing rate at a boundary between the V region and the OSF region=0.54 mm/min.

The growing rate at a boundary between the OSF region and the N region where defects were detected by Cu deposition treatment=0.53 mm/min.

The growing rate at a boundary between the N region where the defects were detected by Cu deposition treatment and the N region where a defect was not detected by Cu deposition treatment=0.52 mm/min.

The growing rate at a boundary between the N region where a defect was not detected by Cu deposition treatment and the I region=0.50 mm/min.

Next, based on the above results, the silicon single crystal was pulled with controlling a growing rate in 0.52-0.50 mm/min from 10 cm of the straight body to the tail part of the straight body, intending N region where a defect was not detected by Cu deposition treatment (see FIGS. 17(a) and (b)). The pulled silicon single crystal was processed to provide a mirror-finished wafer. Then, oxide dielectric breakdown voltage characteristic thereof was evaluated. The conditions of C mode measurement are as follows.
1) Oxide-film: 25 nm
2) measurement electrodes: phosphorus doped poly silicon
3) electrode area: 8 mm$^2$
4) current density in decision: 1 mA/cm$^2$ As a result, oxide dielectric breakdown voltage level was a good chip yield of 100%.

Next, using the wafer produced by the same method as used for evaluation of oxide dielectric breakdown voltage characteristic, evaluation of oxygen concentration distribution in a radial direction in plane was carried out. Specifically, oxygen concentration was measured by using FT-IR (Fourier transform infrared spectroscopic analysis) method as a method for measuring oxygen concentration, and using as a point for measurement 21 points in total on the line connecting points at 5 mm from both ends of the wafer and going on the center of the wafer surface. The results are shown in FIG. 18.

FIG. 18 shows that oxygen concentration in the single crystal to be produced can be made almost uniform in a radial direction in plane if the heater of the present invention is used.

COMPARATIVE EXAMPLE 4

The graphite heater shown in FIG. 20 was used. This graphite heater has an heat generating part with a full length of 500 mm, and ten upper slits and twelve lower slits are provided therein. All of the upper slits have a length of 400 mm, and all of the lower slits have a length of 400 mm. The silicon single crystal was produced under the same conditions as Example 4 except that the above-mentioned graphite heater was used. OSF, FPD, LEP, and Cu deposition were investigated in a similar manner to Example 4.

As a result, the distribution in each region was as shown in FIG. 16(b). That is, a growing rate of each boundary of the regions was as follows.

A growing rate at the boundary between the V region and the OSF region=0.50 mm/min.

A growing rate at the boundary between the OSF region and the N region where defects were detected by Cu deposition treatment=0.49 mm/min.

A growing rate at the boundary between the N region where defects were detected by Cu deposition treatment, and the N region where defects were not detected by Cu deposition treatment=0.48 mm/min.

A growing rate of the boundary between the N region where a defect was not detected by Cu deposition treatment and I region=0.46 mm/min.

Next, taking the above-mentioned results into consideration, a silicon single crystal was pulled with controlling a growing rate to be 0.48 to 0.46 mm/min from 10 cm of the straight body to the tail part of the straight body, so that the N region where defects were not detected by Cu deposition treatment may be aimed (see FIGS. 17(a) and (b)). The pulled silicon single crystal was processed into the wafer which was subjected to mirror-finishing, and oxide dielectric breakdown voltage characteristic was evaluated in a similar manner to Example 4.

As a result, oxide dielectric breakdown voltage level was good chip yield of 100%.

Next, using the wafer produced by the same method as used for evaluation of oxide dielectric breakdown voltage characteristic, evaluation of oxygen concentration distribution in a radial direction in plane was carried out in a similar manner to Example 4. The results are shown in FIG. 18.

FIG. 18 shows that, as compared with Example 4, oxygen concentration in the single crystal to be produced is made very uneven in a radial direction in plane if the conventional heater is used.

FIG. 16 shows distribution of various defects for a growing rate in Example 4 and Comparative Example 4. According to them, it has been found that when pulling a single crystal in N region where a defect was not detected by Cu deposition treatment, it is necessary to grow at a low speed as 0.48-0.46 mm/min in Comparative Example 4, whereas it can be grown at a very high speed as 0.52-0.50 mm/min in Example 4 (see FIG. 16).

Therefore, when the graphite heater of the present invention is used, productivity can be improved, and production cost can be lowered, and further, the oxygen concentration in the single crystal to be produced can be made almost uniform in a radial direction.

The present invention is not limited to the above-described embodiment. The above-described embodiment is a mere example, and those having the substantially same structure as technical ideas described in the appended claims and providing the similar action and effects are included in the scope of the present invention.

For example, although the usual CZ method in which a magnetic field is not impressed when pulling a silicon single crystal has been explained in Examples 1-3 of the present invention, the present invention is not limited to this, but can be applied also to the MCZ method in which a magnetic field is impressed.

Moreover, although the above-mentioned Example 4 gave and explained as the example about the MCZ method which impressed the horizontal magnetic field of 4000 G in the core of a crystal at the time of pulling of a silicon single crystal, the present invention is not limited to this, but it can be applied also to the CZ method which does not impress a magnetic field.

Moreover, although the case where the diameter of the silicon single crystal to be produced is 8 inches (200 mm) has been explained in the above-mentioned Examples 1-4, the present invention is not limited thereto, but it can be applied also to the case where the crystal with any diameter is produced, or the case where the apparatus for producing a single crystal with any size is used.

The invention claimed is:

1. A graphite heater for producing a single crystal used when producing a single crystal by the Czochralski method comprising:
   at least a terminal part to which electric current is supplied; and
   a cylindrical heat generating part that generates heat by resistance heating,
   wherein the cylindrical heat generating part surrounds a crucible that contains a raw material melt,
   wherein the heat generating part has heat generating slit parts formed by upper slits extending downward from an upper end of the heat generating part and lower slits extending upward from a lower end of the heat generating part by turns, and
   wherein a length of at least one slit of the upper slits differs from other upper slits and/or a length of at least one slit of the lower slits differs from other lower slits so that a heat generating distribution of the heat generating part may be changed.

2. The graphite heater for producing a single crystal according to claim 1 wherein the upper slit and/or the lower slit having a different length from other slits is periodically formed in a circumferential direction, resulting in that the heat generating distribution of the heat generating part is such that the high temperature part and the low temperature part are distributed periodically in a circumferential direction.

3. The graphite heater for producing a single crystal according to claim 2 wherein the cycle of the heat generating distribution is such that one cycle is 180°.

4. The graphite heater for producing a single crystal according to claim 3 wherein the cycle of the heat generating distribution is such that the cycle based on the upper slit and the cycle based on the lower slit are shifted by 45° or more and 135° or less in a circumferential direction.

5. The graphite heater for producing a single crystal according to claim 4 which has two or more kinds of the upper slit having a length different from other slits and/or two or more kinds of the lower slit having a length different from other slits.

6. The graphite heater for producing a single crystal according to claim 5 wherein the upper slit and/or the lower slit having a different length from other slits has a length shorter than 50% of a length from the upper end to the lower end of the cylindrical heat generating part.

7. The graphite heater for producing a single crystal according to claim 2 wherein the cycle of the heat generating distribution is such that the cycle based on the upper slit and the cycle based on the lower slit are shifted by 45° or more and 135° or less in a circumferential direction.

8. The graphite heater for producing a single crystal according to claim 1 which has two or more kinds of the upper slit having a length different from other slits and/or two or more kinds of the lower slit having a length different from other slits.

9. The graphite heater for producing a single crystal according to claim 1 wherein the upper slit and/or the lower slit having a length different from other slits has a length shorter than 50% of a length from the upper end to the lower end of the cylindrical heat generating part.

10. An apparatus for producing a single crystal comprising the graphite heater for producing a single crystal according to claim 1.

11. The graphite heater for producing a single crystal according to claim 1 wherein a length of the upper slit consists of two kinds, namely longer and shorter, a length of the lower slit consists of two kinds, namely longer and shorter, and the number of the shorter lower slit is more than the number of the shorter upper slit to change a heat generating distribution in the heat generating part.

12. The graphite heater for producing a single crystal according to claim 11 wherein the number of the shorter lower slit is twice or more and 5 times or less of the number of the shorter upper slit.

13. The graphite heater for producing a single crystal according to claim 12 wherein the two kinds of the upper slit and the lower slit are formed periodically in a circumferential direction, resulting in that the heat generating distribution of the heat generating part is such that a high temperature part and a low temperature part are periodically distributed in a circumferential direction.

14. The graphite heater for producing a single crystal according to claim 13 wherein the cycle of the heat generating distribution is such that one cycle is 180°.

15. The graphite heater for producing a single crystal according to claim 14 wherein the cycle of the heat generating distribution is such that the cycle based on the upper slit and the cycle based on the lower slit are shifted by 45° or more and 135° or less in a circumferential direction.

16. The graphite heater for producing a single crystal according to claim 15 wherein the shorter upper slit and lower slit has a length shorter than 50% of a length from the upper end to the lower end of the heat generating part.

17. The graphite heater for producing a single crystal according to claim 16 wherein the longer upper slit and lower slit has a length of 70% or longer of a length from the upper end to the lower end of the heat generating part.

18. The graphite heater for producing a single crystal according to claim 13 wherein the cycle of the heat generating distribution is such that the cycle based on the upper slit and the cycle based on the lower slit are shifted by 45° or more and 135° or less in a circumferential direction.

19. The graphite heater for producing a single crystal according to claim 11 wherein the two kinds of the upper slit and the lower slit are formed periodically in a circumferential direction, resulting in that the heat generating distribution of the heat generating part is such that a high temperature part and a low temperature part are periodically distributed in a circumferential direction.

20. The graphite heater for producing a single crystal according to claim 19 wherein the cycle of the heat generating distribution is such that one cycle is 180°.

21. The graphite heater for producing a single crystal according to claim 20 wherein the cycle of the heat generating distribution is such that the cycle based on the upper slit and the cycle based on the lower slit are shifted by 45° or more and 135° or less in a circumferential direction.

22. The graphite heater for producing a single crystal according to claim 19 wherein the cycle of the heat generating distribution is such that the cycle based on the upper slit and the cycle based on the lower slit are shifted by 45° or more and 135° or less in a circumferential direction.

23. The graphite heater for producing a single crystal according to claim 11 wherein the shorter upper slit and lower slit has a length shorter than 50% of a length from the upper end to the lower end of the heat generating part.

24. The graphite heater for producing a single crystal according to claim 11 wherein the longer upper slit and lower slit has a length of 70% or longer of a length from the upper end to the lower end of the heat generating part.

25. An apparatus for producing a single crystal comprising the graphite heater for producing a single crystal according to claim 11.

26. The graphite heater for producing a single crystal according to claim 1 wherein a length of the upper slit consists of two kinds, namely longer and shorter, and a width of a lower end of the longer upper slit is wider than a width of an upper end thereof, and/or a width of a lower end of the lower slit is wider than a width of an upper end thereof to change the heat generating distribution of the heat generating part.

27. The graphite heater for producing a single crystal according to claim 26 wherein the lower end of the longer upper slit has a width of 1.5 times or more and 2.5 times or less of a width of the upper end thereof, and the lower end of the lower slit has a width of 1.5 times or more and 2.5 times or less of a width of the upper end thereof.

28. The graphite heater for producing a single crystal according to claim 27 wherein the shorter upper slit has a length shorter than 50% of a length from the upper end to the lower end of the heat generating part.

29. The graphite heater for producing a single crystal according to claim 28 wherein the longer upper slit has a length of 70% or longer of a length from the upper end to the lower end of the heat generating part.

30. The graphite heater for producing a single crystal according to claim 29 wherein the two kinds of the upper slit are formed periodically in a circumferential direction, resulting in that the heat generating distribution of the heat genenrating part is such that a high temperature part and a low temperature part are periodically distributed in a circumferential direction.

31. The graphite heater for producing a single crystal according to claim 30 wherein the cycle of the heat generating distribution is such that one cycle is 180°.

32. The graphite heater for producing a single crystal according to claim 26 wherein the shorter upper slit has a length shorter than 50% of a length from the upper end to the lower end of the heat generating part.

33. The graphite heater for producing a single crystal according to claim 26 wherein the longer upper slit has a length of 70% or longer of a length from the upper end to the lower end of the heat generating part.

34. The graphite heater for producing a single crystal according to claim 26 wherein the two kinds of the upper slit are formed periodically in a circumferential direction, resulting in that the heat generating distribution of the heat genenrating generating part is such that a high temperature part and a low temperature part are periodically distributed in a circumferential direction.

35. The graphite heater for producing a single crystal according to claim 34 wherein the cycle of the heat generating distribution is such that one cycle is 180°.

36. An apparatus for producing a single crystal comprising the graphite heater for producing a single crystal according to claim 26.

37. The graphite heater for producing a single crystal according to claim 1 wherein each of a length of the upper slit and a length of the lower slit consists of two kinds, namely longer and shorter, and the number of the shorter upper slit is more than the number of the shorter lower slit, to change the heat generating distribution of the heat generating part.

38. The graphite heater for producing a single crystal according to claim 37 wherein the number of the shorter upper slit is 1.5 times or more and 5 times or less of the number of the shorter lower slit.

39. The graphite heater for producing a single crystal according to claim 38 wherein the two kinds of the upper slit and the lower slit are formed periodically in a circumferential direction, resulting in that the heat generating distribution of the heat generating part is such that a high temperature part and a low temperature part are periodically distributed in a circumferential direction.

40. The graphite heater for producing a single crystal according to claim 39 wherein the cycle of the heat generating distribution is such that one cycle is 180°.

41. The graphite heater for producing a single crystal according to claim 40 wherein the cycle of the heat generating distribution is such that the cycle based on the upper slit and the cycle based on the lower slit are shifted by 45° or more and 135° or less in a circumferential direction.

42. The graphite heater for producing a single crystal according to claim 41 wherein the shorter upper slit and lower slit has a length shorter than 50% of a length from the upper end to the lower end of the heat generating part.

43. The graphite heater for producing a single crystal according to claim 42 wherein the longer upper slit and lower slit has a length of 70% or longer of a length from the upper end to the lower end of the heat generating part.

44. The graphite heater for producing a single crystal according to claim 39 wherein the cycle of the heat generating distribution is such that the cycle, based on the upper slit and the cycle based on the lower slit are shifted by 45° or more and 135° or less in a circumferential direction.

45. The graphite heater for producing a single crystal according to claim 37 wherein the two kinds of the upper slit and the lower slit are formed periodically in a circumferential direction, resulting in that the heat generating distribution of the heat generating part is such that a high temperature part and a low temperature part are periodically distributed in a circumferential direction.

46. The graphite heater for producing a single crystal according to claim 45 wherein the cycle of the heat generating distribution is such that one cycle is 180°.

47. The graphite heater for producing a single crystal according to claim 46 wherein the cycle of the heat generating distribution is such that the cycle based on the upper slit and the cycle based on the lower slit are shifted by 45° or more and 135° or less in a circumferential direction.

48. The graphite heater for producing a single crystal according to claim 45 wherein the cycle of the heat generating distribution is such that the cycle based on the upper slit and the cycle based on the lower slit are shifted by 45° or more and 135° or less in a circumferential direction.

49. The graphite heater for producing a single crystal according to claim 37 wherein the shorter upper slit and lower slit has a length shorter than 50% of a length from the upper end to the lower end of the heat generating part.

50. An apparatus for producing a single crystal comprising the graphite heater for producing a single crystal according to claim 49.

51. The graphite heater for producing a single crystal according to claim 37 wherein the longer upper slit and lower slit has a length of 70% or longer of a length from the upper end to the lower end of the heat generating part.

52. A graphite heater for producing a single crystal used when producing a single crystal by the Czochralski method comprising:

at least a terminal part to which electric current is supplied; and a cylindrical heat generating part by resistance heating, wherein the cylindrical heat generating part surrounds a crucible that contains a raw material melt, and wherein a heat generating distribution of the heat generating part is such that a high temperature part and a low temperature part are periodically distributed in a circumferential direction, and a cycle of the heat generating distribution of the heat generating part is shifted between an upper side and a lower side of a central line dividing the heat generating part in a height direction to the upper side and the lower side.

53. The graphite heater for producing a single crystal according to claim 52 wherein the periodic heat generating distribution in a circumferential direction of the heat generating part is made by changing any one or more of a wall thickness of a heat generating slit part, a width of a heat generating slit part, a length of a slit, and a material of a heat generating slit part.

54. The graphite heater for producing a single crystal according to claim 53 wherein the cycle of the heat generating distribution is such that one cycle is 180°.

55. The graphite heater for producing a single crystal according to claim 54 wherein a shift of the cycle of the heat generating distribution between the upper side and the lower side of the central line is 45° or more and 135° or less.

56. The graphite heater for producing a single crystal according to claim 52 wherein the cycle of the heat generating distribution is such that one cycle is 180°.

57. The graphite heater for producing a single crystal according to claim 52 wherein a shift of the cycle of the heat generating distribution between the upper side and the lower side of the central line is 45° or more and 135° or less.

58. An apparatus for producing a single crystal comprising the graphite heater for producing a single crystal according to claim 52.

* * * * *